United States Patent
Qian et al.

(10) Patent No.: US 9,734,751 B2
(45) Date of Patent: Aug. 15, 2017

(54) INVERTER, DRIVING CIRCUIT AND DISPLAY PANEL

(71) Applicants: Shanghai Tianma AM-OLED Co., Ltd., Shanghai (CN); Tianma Micro-electronics Co., Ltd., Shenzhen (CN)

(72) Inventors: Dong Qian, Shanghai (CN); Yue Li, Shanghai (CN); Tong Zhang, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/417,230

(22) Filed: Jan. 27, 2017

(65) Prior Publication Data
US 2017/0132968 A1    May 11, 2017

Related U.S. Application Data

(63) Continuation-in-part of application No. 14/586,810, filed on Dec. 30, 2014, now Pat. No. 9,584,127.

(30) Foreign Application Priority Data

Oct. 13, 2014    (CN) .......................... 2014 1 0538426

(51) Int. Cl.
*G09G 3/20*    (2006.01)
*H03K 19/003*    (2006.01)

(52) U.S. Cl.
CPC ..... *G09G 3/2092* (2013.01); *H03K 19/00315* (2013.01); *G09G 2300/08* (2013.01);
(Continued)

(58) Field of Classification Search
CPC ........ G09G 2310/0291; G09G 3/3266; H02M 2001/0054; H03K 19/00315; H03K 19/0944
See application file for complete search history.

(56) References Cited

U.S. PATENT DOCUMENTS

2007/0188196 A1    8/2007 Yu
2012/0206432 A1    8/2012 Kang
(Continued)

FOREIGN PATENT DOCUMENTS

CN        103268749 A    8/2013
KR    1020080114365 A    12/2008

*Primary Examiner* — Viet Pham
(74) *Attorney, Agent, or Firm* — Anova Law Group, PLLC

(57) ABSTRACT

An inverter, a driving circuit, and a display panel are provided. The inverter comprises first, second, third, fourth, fifth, and sixth transistors, and first and second capacitors. The first transistor has a gate electrode connected with an initial signal input terminal, and a drain electrode connected with a source electrode of the sixth transistor. The second transistor has a drain electrode connected with a first clock signal input terminal. The fifth transistor has a source electrode connected with an output terminal. The sixth transistor has a drain electrode connected with a gate electrode of the fifth transistor. A gate electrode of the second transistor is controlled in such a way to prevent reverse conduction of the second transistor, the second capacitor is configured to maintain an electrical potential at the gate electrode of the fifth transistor, and the initial signal and the output signal are inverse to each other.

20 Claims, 21 Drawing Sheets

(52) U.S. Cl.
CPC .............. *G09G 2310/0267* (2013.01); *G09G 2310/0275* (2013.01); *G09G 2310/0286* (2013.01); *G09G 2310/08* (2013.01)

(56) References Cited

U.S. PATENT DOCUMENTS

2013/0222352 A1  8/2013  Jeong
2014/0145919 A1  5/2014  Qian

INVERTER, DRIVING CIRCUIT AND DISPLAY PANEL

CROSS-REFERENCES TO RELATED APPLICATIONS

This application is a continuation-in-part (CIP) application of U.S. patent application Ser. No. 14/586,810, filed on Dec. 30, 2014, which claims the priority to Chinese Patent Application No. 201410538426.2, entitled "INVERTER, DRIVING CIRCUIT AND DISPLAY PANEL", filed on Oct. 13, 2014 with the State Intellectual Property Office of People's Republic of China, the content of all of which is incorporated herein by reference in its entirety.

TECHNICAL FIELD

The disclosure relates to the field of display technologies, and more particularly to an inverter, a driving circuit and a display panel.

BACKGROUND OF THE INVENTION

An inverter operates in response to an input signal to provide an output signal that is the inverse of the input signal. With the development of electronic technology, inverters are widely employed. For example, an inverter may be employed in a transmission driving circuit of an organic light-emitting display device to provide a corresponding electric potential for a pixel compensation circuit electrically connected with the transmission driving circuit, such that the pixel compensation circuit can accomplish node initialization, threshold value compensation, data writing and the like.

FIG. 1A is a circuit diagram of an inverter in the related art. As shown in FIG. 1A, the inverter includes a first transistor P1, a second transistor P2, a third transistor P3, a fourth transistor P4 and a capacitor C0, where the first to fourth transistors P1 to P4 are all P-Channel Metal Oxide Semiconductor (PMOS) transistors. A gate electrode of the first transistor P1 is electrically connected with an initial signal input terminal IN0 for receiving an initial signal, a source electrode of the first transistor P1 is electrically connected with a first electrical level signal input terminal VG1 for receiving a first electrical level signal, and a drain electrode of the first transistor P1 is electrically connected, via the capacitor C0, with a first clock signal input terminal CK1 for receiving a first clock signal.

A gate electrode of the second transistor P2 is electrically connected with a second clock signal input terminal CK2 for receiving a second clock signal, a source electrode of the second transistor P2 is electrically connected with both the drain electrode of the first transistor P1 and a gate electrode of the fourth transistor P4, and a drain electrode of the second transistor P2 is electrically connected with a second electrical level signal input terminal VG2 for receiving a second electrical level signal.

A gate electrode of the third transistor P3 is electrically connected with the initial signal input terminal IN0, a source electrode of the third transistor P3 is electrically connected with the first electrical level signal input terminal VG1, and a drain electrode of the third transistor P3 is electrically connected with an output terminal OUT0 for outputting an output signal; a source electrode of the fourth transistor P4 is electrically connected with the output terminal OUT0, and a drain electrode of the fourth transistor P4 is electrically connected with the second electrical level signal input terminal VG2. Here, the first electrical level signal is a constant high-level signal, and the second electrical level signal is a constant low-level signal.

FIG. 1B is a diagram showing waveforms of various signals of the inverter shown in FIG. 1A. As shown in FIG. 1B, SIN0 represents the initial signal, SCK1 represents the first clock signal, SCK2 represents the second clock signal, and SOUT0 represents the output signal. When the first clock signal SCK1 changes from a low-level to a high-level, an electric potential of the gate electrode of the fourth transistor P4 is affected and hence the turning-on of the fourth transistor P4 is affected because of a Bootstrap effect of the capacitor C0 (i.e. electric charge of the capacitor C0 is conserved), so that transmission of the second electrical level signal to the output terminal OUT via the fourth transistor P4 is affected, and the value of a low-level of the output signal SOUT0 is affected, thus resulting in instability of the output signal.

The disclosed inverter, driving circuit and display panel are directed to solve one or more problems set forth above and other problems.

BRIEF SUMMARY OF THE INVENTION

One aspect of the present disclosure provides an inverter. The inverter comprises a first transistor, wherein a gate electrode of the first transistor is electrically connected with an initial signal input terminal for receiving an initial signal, and a source electrode of the first transistor is electrically connected with a second clock signal input terminal for receiving a second clock signal; a second transistor, wherein a drain electrode of the second transistor is electrically connected, via a first capacitor, with a first clock signal input terminal for receiving a first clock signal; a third transistor, wherein a gate electrode of the third transistor is electrically connected with the second clock signal input terminal for receiving the second clock signal, a source electrode of the third transistor is electrically connected with the drain electrode of the second transistor, and a drain electrode of the third transistor is electrically connected with a second electrical level signal input terminal for receiving a second electrical level signal; a fourth transistor, wherein a gate electrode of the fourth transistor is electrically connected with the initial signal input terminal, a source electrode of the fourth transistor is electrically connected with a first electrical level signal input terminal, and a drain electrode of the fourth transistor is electrically connected with an output terminal for outputting an output signal; a fifth transistor, wherein a source electrode of the fifth transistor is electrically connected with the output terminal, and a drain electrode of the fifth transistor is electrically connected with the second electrical level signal input terminal; a sixth transistor, wherein a gate electrode of the sixth transistor is electrically connected with the first clock signal input terminal for receiving the first clock signal, a drain electrode of the sixth transistor is electrically connected with a gate electrode of the fifth transistor and is electrically connected with the output terminal via a second capacitor, and a source electrode of the sixth transistor is electrically connected with a drain electrode of the first transistor. A gate electrode of the second transistor is controlled in such a way to prevent reverse conduction of the second transistor, the second capacitor is configured to maintain an electrical potential at the gate electrode of the fifth transistor, and the initial signal and the output signal are inverse to each other.

Another aspect of the present disclosure provides a driving circuit comprising the disclosed inverter.

Another aspect of the present disclosure provides a display panel comprising the disclosed driving circuit.

Other aspects of the present disclosure can be understood by those skilled in the art in light of the description, the claims, and the drawings of the present disclosure.

BRIEF DESCRIPTION OF THE DRAWINGS

Other features, objects and advantages of the present disclosure will become apparent from the following detailed description made to nonrestrictive embodiments with reference to the accompanying drawings below, in which.

DETAILED DESCRIPTION OF THE PREFERRED EMBODIMENTS

Figure 1A:
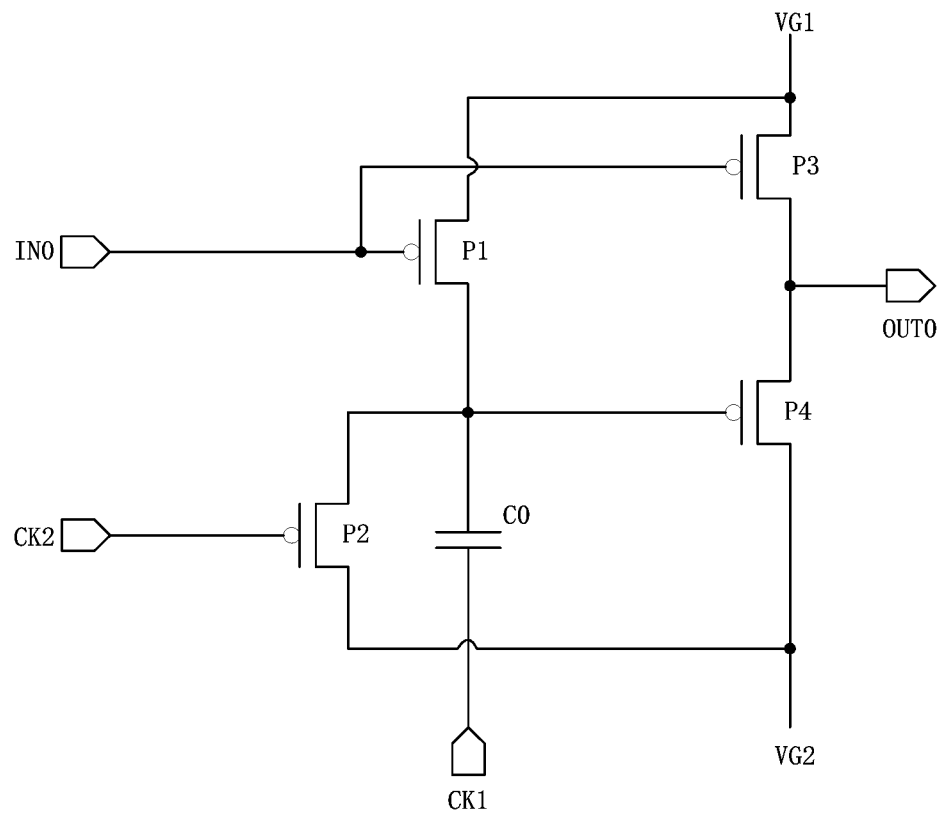
FIG. 1A is a circuit diagram of an inverter in the related art.
Figure 1B:
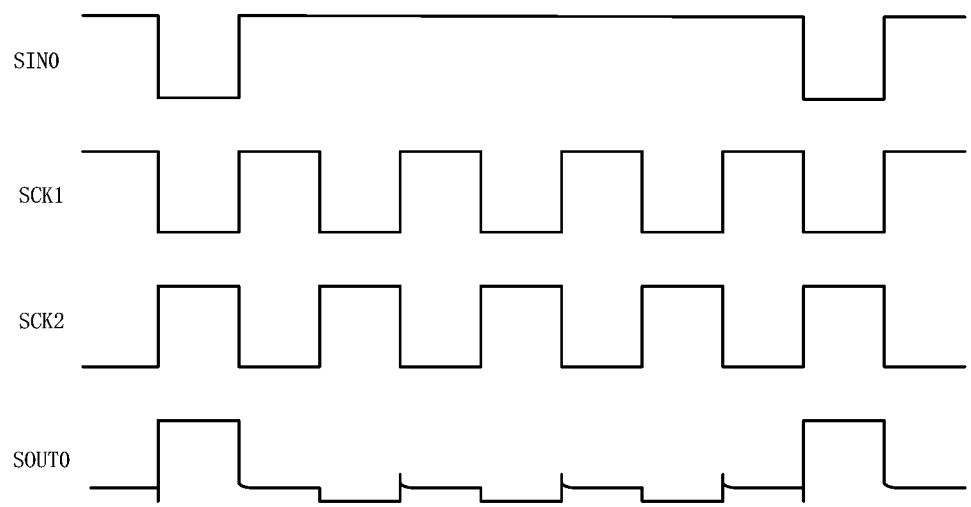
FIG. 1B is a diagram showing waveforms of various signals of the inverter shown in FIG. 1A.

The present disclosure will be further described in detail below in conjunction with the accompanying drawings and embodiments. It is understood that specific embodiments described herein are merely for explaining the present disclosure rather than limiting the present disclosure. Additionally, it is noted that only portions relevant to the present disclosure rather than all portions are described in the accompanying drawings for purposes of clarity.

First Embodiment

The first embodiment of the disclosure provides an inverter, including a first transistor, a second transistor, a third transistor, a fourth transistor, a fifth transistor, a first capacitor and a second capacitor. A gate electrode of the first transistor is electrically connected with an initial signal input terminal for receiving an initial signal, a source electrode of the first transistor is electrically connected with a first electrical level signal input terminal for receiving a first electrical level signal, and a drain electrode of the first transistor is electrically connected with a source electrode of the second transistor and a gate electrode of the fifth transistor; a drain electrode of the second transistor is electrically connected, via the first capacitor, with a first clock signal input terminal for receiving a first clock signal.

A gate electrode of the third transistor is electrically connected with a second clock signal input terminal for receiving a second clock signal, a source electrode of the third transistor is electrically connected with the drain electrode of the second transistor, and a drain electrode of the third transistor is electrically connected with a second electrical level signal input terminal for receiving a second electrical level signal.

A gate electrode of the fourth transistor is electrically connected with the initial signal input terminal, a source electrode of the fourth transistor is electrically connected with a first electrical level signal input terminal, and a drain electrode of the fourth transistor is electrically connected with an output terminal for outputting an output signal; a source electrode of the fifth transistor is electrically connected with the output terminal, and a drain electrode of the fifth transistor is electrically connected with the second electrical level signal input terminal.

The second transistor has its gate electrode controlled in such a way to prevent reverse conduction of the second transistor. The second capacitor is configured to maintain the electrical potential at the gate electrode of the fifth transistor, and the initial signal and the output signal are inverse to each other.

In addition to the implementation of the invertor function based on the various transistors and capacitors included in the inverter, the reverse conduction of the second transistor is prevented by controlling the gate electrode of the second transistor, and the electrical potential at the gate electrode of the fifth transistor is maintained by the second capacitor. The electrical potential at the gate electrode of the fifth transistor can be maintained stable when the first clock signal changes from a high-level to a low-level (in the case where the first to fifth transistors are all N-Channel Metal Oxide Semiconductor (NMOS) transistors) or from a low-level to a high-level (in the case where the first to fifth transistors are all PMOS transistors), so that the output signal of the inverter may not be affected by the change of the first clock signal, thus enabling the inverter to generate a stable output signal.

Further, in the first embodiment, the first transistor, the second transistor, the third transistor, the fourth transistor and the fifth transistor are all NMOS transistors or PMOS transistors. In following various embodiments regarding the inverter, description is made by an example where all the transistors are PMOS transistors. However, it is understood that all the transistors can be NMOS transistors, where high-levels of various signals correspond to low-levels of the signals in the case where all the transistors are PMOS transistors, and low-levels of various signals correspond to high-levels of the signals in the case where all the transistors are PMOS transistors.

Further, in the first embodiment, the initial signal, the output signal, the first clock signal and the second clock signal are all pulse signals, where the first clock signal and the second clock signal are inverse to each other. It should be noted that the value of a high-level of the initial signal, the output signal, the first clock signal and the second clock signal may be set at 10V, and the value of a low-level thereof may be set at −5V, or may be set at other values according to the types of the transistors and actual requirements.

Further, in the first embodiment, both the first electrical level signal and the second electrical level signal are constant. It should be noted that when the first to fifth transistors are all PMOS transistors, the first electrical level signal is a high-level signal which may have a level of 10V, and the second electrical level signal is a low-level signal which may have a level of −5V. Likewise, when the first to fifth transistors are all NMOS transistors, the first electrical level signal is a low-level signal which may have a level of −5V, and the second electrical level signal is a high-level signal which may have a level of 10V. Of course, the level of the first electrical level signal and the second electrical level signal may be set at other values according to actual requirements.

Based on the above-described principles, given that the function of the inverter can be achieved, the circuit structure of the inverter, including for example a position at which the gate electrode of the second transistor is electrically connected and a position at which the second capacitor is electrically connected, may be implemented in various ways, as long as the output signal of the inverter is not affected by the change of the first clock signal and maintains stable when the first clock signal changes from a low-level to a high-level (in the case of description below made by taking an example where the first to fifth transistors are all PMOS transistors). Preferred embodiments are illustrated in detail below.

Second Embodiment

Figure 2A:
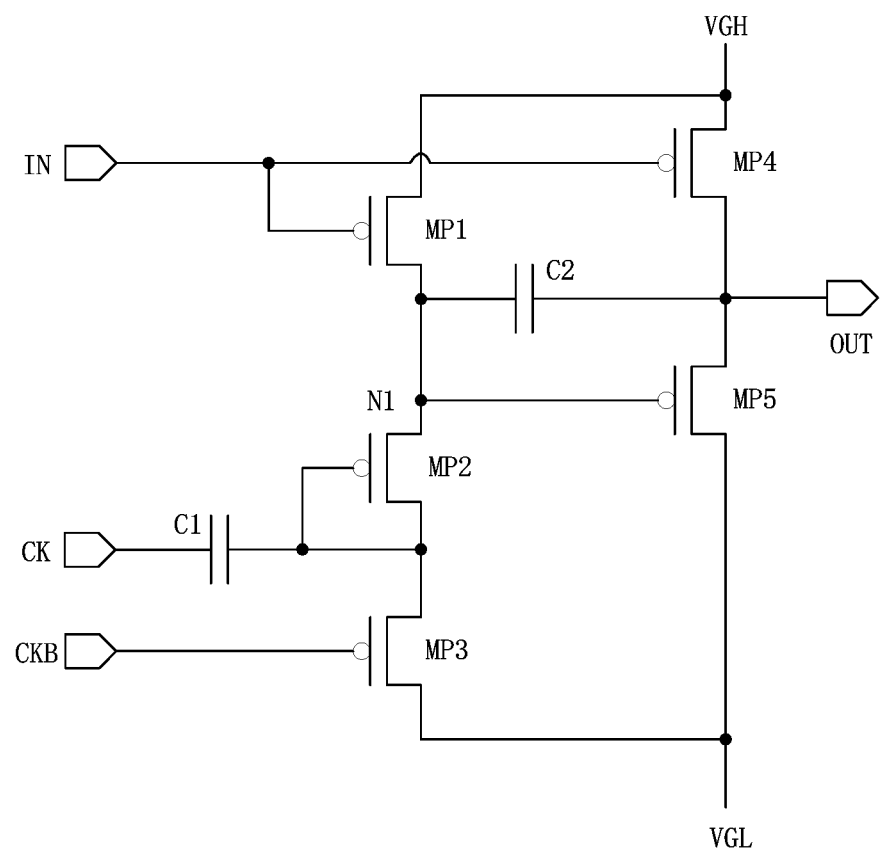
FIG. 2A is a circuit diagram of an inverter according to a second embodiment of the disclosure.

FIG. 2A is a circuit diagram of an inverter according to a second embodiment of the disclosure. As shown in FIG. 2A, an inverter in the second embodiment of the disclosure includes a first transistor MP1, a second transistor MP2, a third transistor MP3, a fourth transistor MP4, a fifth transistor MP5, a first capacitor C1 and a second capacitor C2. A gate electrode of the first transistor MP1 is electrically connected with an initial signal input terminal IN for receiving an initial signal, a source electrode of the first transistor MP1 is electrically connected with a first electrical level signal input terminal VGH for receiving a first electrical level signal, and a drain electrode of the first transistor MP1 is electrically connected with a source electrode of the second transistor MP2 and a gate electrode of the fifth transistor MP5.

A gate electrode of the second transistor MP2 is electrically connected with a drain electrode of the second transistor MP2, and the drain electrode of the second transistor MP2 is further electrically connected, via the first capacitor C1, with a first clock signal input terminal CK for receiving a first clock signal. A gate electrode of the third transistor MP3 is electrically connected with a second clock signal input terminal CKB for receiving a second clock signal, a source electrode of the third transistor MP3 is electrically connected with the drain electrode of the second transistor MP2, and a drain electrode of the third transistor MP3 is electrically connected with a second electrical level signal input terminal VGL for receiving a second electrical level signal.

A gate electrode of the fourth transistor MP4 is electrically connected with the initial signal input terminal IN, a source electrode of the fourth transistor MP4 is electrically connected with the first electrical level signal input terminal VGH, and a drain electrode of the fourth transistor MP4 is electrically connected with an output terminal OUT for outputting an output signal. A gate electrode of the fifth transistor MP5 is electrically connected with the output terminal OUT via the second capacitor C2, a source electrode of the fifth transistor MP5 is electrically connected with the output terminal OUT, and a drain electrode of the fifth transistor MP5 is electrically connected with the second electrical level signal input terminal VGL.

Based on the above-described first embodiment, in the second embodiment, the reverse conduction of the second transistor MP2 is prevented by electrically connecting the gate electrode of the second transistor MP2 with the drain electrode of the second transistor MP2 to form a diode, and the electrical potential at the gate electrode of the fifth transistor MP5 is maintained through the second capacitor C2 by electrically connecting the gate electrode of the fifth transistor MP5 with the output terminal OUT via the second capacitor C2.

Figure 2B:
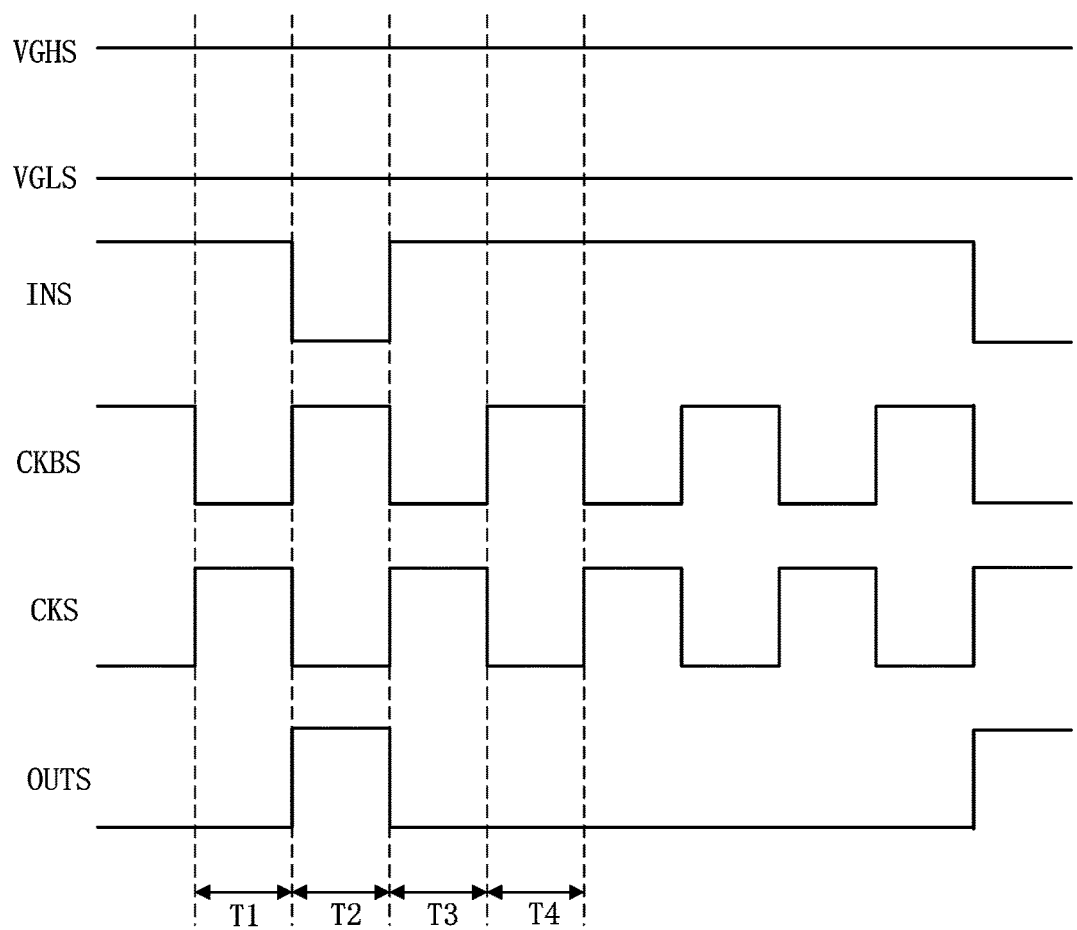
FIG. 2B is a diagram showing waveforms of various signals of the inverter shown in FIG. 2A.

FIG. 2B is a diagram showing waveforms of various signals of the inverter shown in FIG. 2A. As shown in FIG. 2B, INS represents the initial signal, CKS represents the first clock signal, CKBS represents the second clock signal, VGHS represents the first electrical level signal, VGLS represents the second electrical level signal, and OUTS represents the output signal. It should be noted that, in FIG. 2B, the first electrical level signal VGHS is a constant high-level signal, and the second electrical level signal VGLS is a constant low-level signal.

Figure 3A:
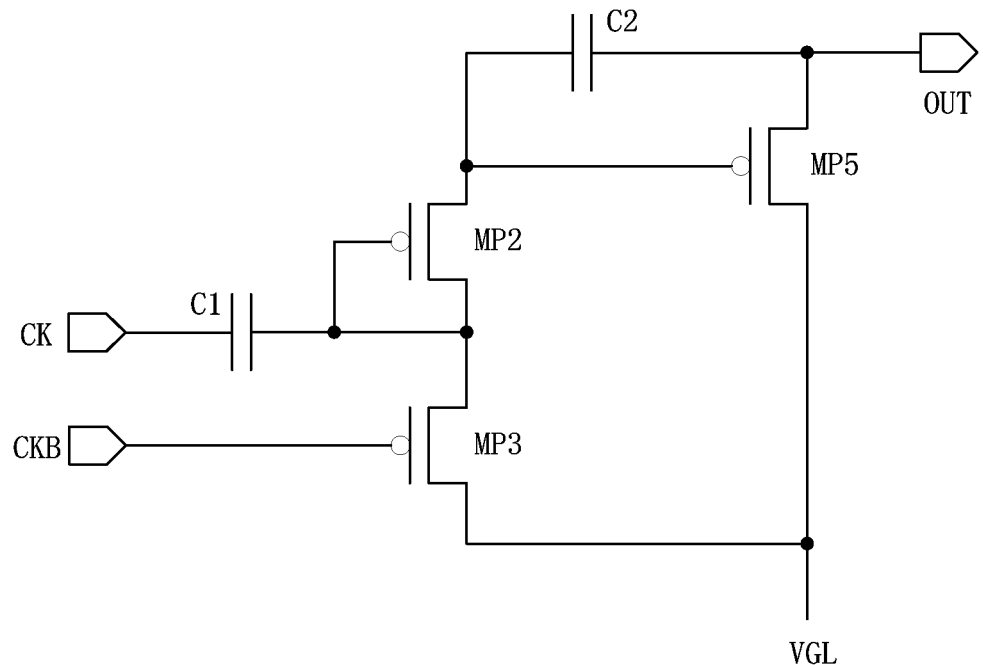
FIGS. 3A to 3C are equivalent circuit diagrams of the inverter shown in FIG. 2A corresponding to various stages shown in FIG. 2B.
Figure 3B:
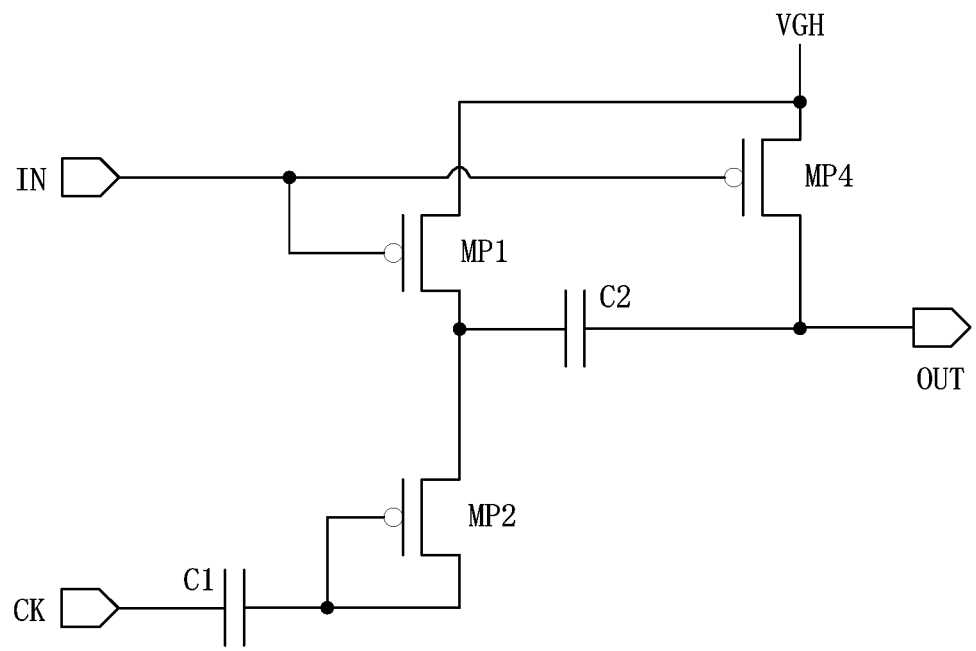
Figure 3C:
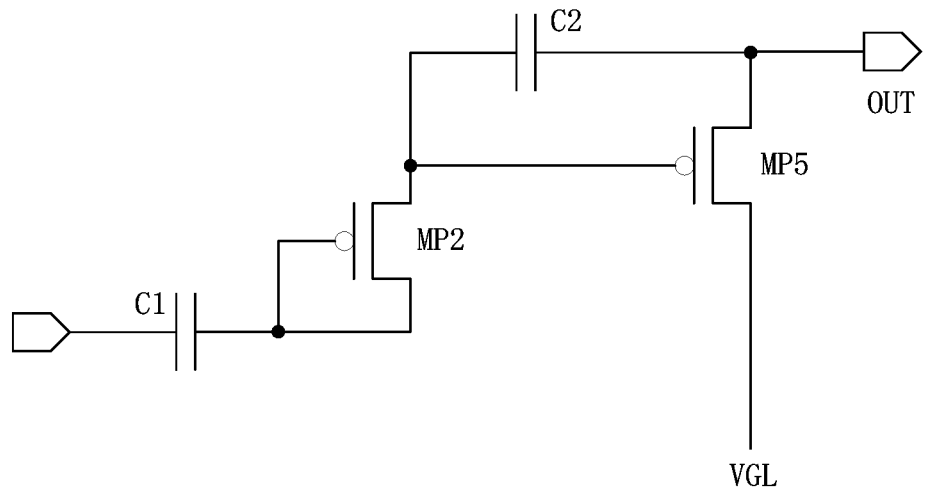

FIGS. 3A to 3C are equivalent circuit diagrams of the inverter shown in FIG. 2A corresponding to various stages shown in FIG. 2B. Referring to FIGS. 2B and 3A to 3C, the inverter has four operation stages including a first stage T1, a second stage T2, a third stage T3 and a fourth stage T4.

At the first stage T1, as shown in FIGS. 2B and 3A, the initial signal INS has a high-level to turn off the first transistor MP1 and the fourth transistor MP4, the second clock signal CKBS has a low-level to turn on the third transistor MP3, the second electrical level signal VGLS has a low-level and is transmitted to the gate electrode of the second transistor MP2 via the third transistor MP3 to turn on the second transistor MP2, and then further transmitted to the gate electrode of the fifth transistor MP5 via the second transistor MP2 to turn on the fifth transistor MP5, so that the second electrical level signal VGLS is transmitted to the output terminal OUT via the fifth transistor MP5 as an output signal OUTS of the first stage T1. In addition, the output signal OUTS of the first stage T1 is a low-level signal, which is inverse to the initial signal INS, therefore the function of the inverter is accomplished at the first stage T1.

At the second stage T2, as shown in FIGS. 2B and 3B, the initial signal INS has a low-level to turn on the first transistor MP1 and the fourth transistor MP4, the first electrical level signal VGHS has a high-level and is transmitted to the gate electrode of the fifth transistor MP5 via the first transistor MP1 to turn off the fifth transistor MP5, the second clock signal CKBS has a high-level to turn off the third transistor MP3, and the first electrical level signal VGHS is transmitted to the output terminal OUT via the fourth transistor MP4 as an output signal OUTS of the second stage T2. In addition, the output signal OUTS of the second stage T2 is a high-level signal, which is inverse to the initial signal INS, therefore the function of the inverter is accomplished at the second stage T2.

It should be noted that, in the second stage T2, the second clock signal CKBS has a high-level to turn off the third transistor MP3. Since the first clock signal CKS in the second stage T2 has a low-level, the electrical potential at the gate electrode of the second transistor MP2 is lowered because of the Bootstrap effect of the first capacitor C1 (i.e. electric charge of the first capacitor C1 is conserved), so that the second transistor MP2 is turned on. The first electrical level signal VGHS has a high-level and charges the gate electrode of the second transistor MP2 through the first transistor MP1 and the second transistor MP2, so that the second transistor MP2 is turned off when the electrical potential at the gate electrode of the second transistor MP2 rapidly reaches a difference between the gate electrode voltage of the fifth transistor MP5 and an absolute value of a threshold voltage of the second transistor MP2, and in the meantime, the electrical potential at the gate electrode of the fifth transistor MP5 remains at a high-level.

At the third stage T3, as shown in FIG. 3A (the equivalent circuit diagram of the inverter at the third stage T3 is the same as that at the first stage T1), the initial signal INS has a high-level to turn off the first transistor MP1 and the fourth transistor MP4, the second clock signal CKBS has a low-level to turn on the third transistor MP3, the second electrical level signal VGLS has a low-level and is transmitted to the gate electrode of the second transistor MP2 via the third transistor MP3 to turn on the second transistor MP2, and then further transmitted to the gate electrode of the fifth transistor MP5 via the second transistor MP2 to turn on the fifth transistor MP5, then the second electrical level signal VGLS is transmitted to the output terminal OUT via the fifth transistor MP5 as an output signal OUTS of the third stage T3. In addition, the output signal OUTS of the third stage T3 is a low-level signal, which is inverse to the initial signal INS, therefore the function of the inverter is accomplished at the third stage T3.

It should be noted that, in the third stage T3, the second clock signal CKBS has a low-level to turn on the third transistor MP3, so that the electrical potential at the gate electrode of the second transistor MP2 is lowered, and the third transistor MP3 is turned off when the electrical potential at the gate electrode of the second transistor MP2 reaches a sum of a level value of the second clock signal CKBS and an absolute value of a threshold voltage of the third transistor MP3 (because the source electrode of the third transistor MP3 is electrically connected with the gate electrode of the second transistor MP2). In addition, when the output signal OUTS changes from a high-level to a low-level, the electrical potential at the gate electrode of the fifth transistor MP5 is much lowered because of the Bootstrap effect of the second capacitor C2, thus ensuring that the fifth transistor MP5 is completely turned on and the output terminal OUT can completely output a low-level of the second electrical level signal VGLS; therefore, when the first clock signal CKS changes from a low-level to a high-level, the first clock signal CKS will not affect the electrical potential at the gate electrode of the fifth transistor MP5, and hence will not affect a level value of the output signal OUTS at the output terminal OUT, so that the resultant output signal OUTS is stable.

At the fourth stage T4, as shown in FIG. 3C, the initial signal INS has a high-level to turn off the first transistor MP1 and the fourth transistor MP4, the second clock signal CKBS has a high-level to turn off the third transistor MP3, the first clock signal CKS controls the electrical potential at the gate electrode of the second transistor MP2 via the first capacitor C1 to turn on the second transistor MP2, the electrical potential at the gate electrode of the second transistor MP2 controls the electrical potential at the gate electrode of the fifth transistor MP5 via the second transistor MP2 to turn on the fifth transistor MP5, and the second electrical level signal VGLS is transmitted to the output terminal OUT via the fifth transistor MP5 as an output signal OUTS of the fourth stage T4. In addition, the output signal OUTS of the fourth stage T4 is a low-level signal, which is inverse to the initial signal INS, therefore the function of the inverter is accomplished at the fourth stage T4.

It should be noted that, in the fourth stage T4, the initial signal INS has a high-level to turn off the first transistor MP1, the second clock signal CKBS has a high-level to turn off the third transistor MP3, and the electrical potential at the gate electrode of the second transistor MP2 become lower because of the Bootstrap effect of the first capacitor C1 when the first clock signal CKS changes from a high-level to a low-level, so that the second transistor MP2 is turned on and further the electrical potential at the gate electrode of the fifth transistor MP5 is low, and the fifth transistor MP5 continuously transmits the level value of the second electrical level signal VGLS to the output terminal OUT, therefore, when the first clock signal CKS changes from a high-level to a low-level, a level value of the output signal OUTS of the output terminal OUT will not be affected, so that the resultant output signal OUTS is stable.

It can be seen from FIG. 2B, the inverter operates alternately in the third stage T3 and the fourth stage T4 between two adjacent second stages T2, in addition, the output signal OUTS of the inverter of the second embodiment in the third stage T3 and the fourth stage T4 is not affected by the change of the first clock signal CKS, therefore the inverter of the second embodiment may obtain a stable output signal OUTS.

Figure 4:
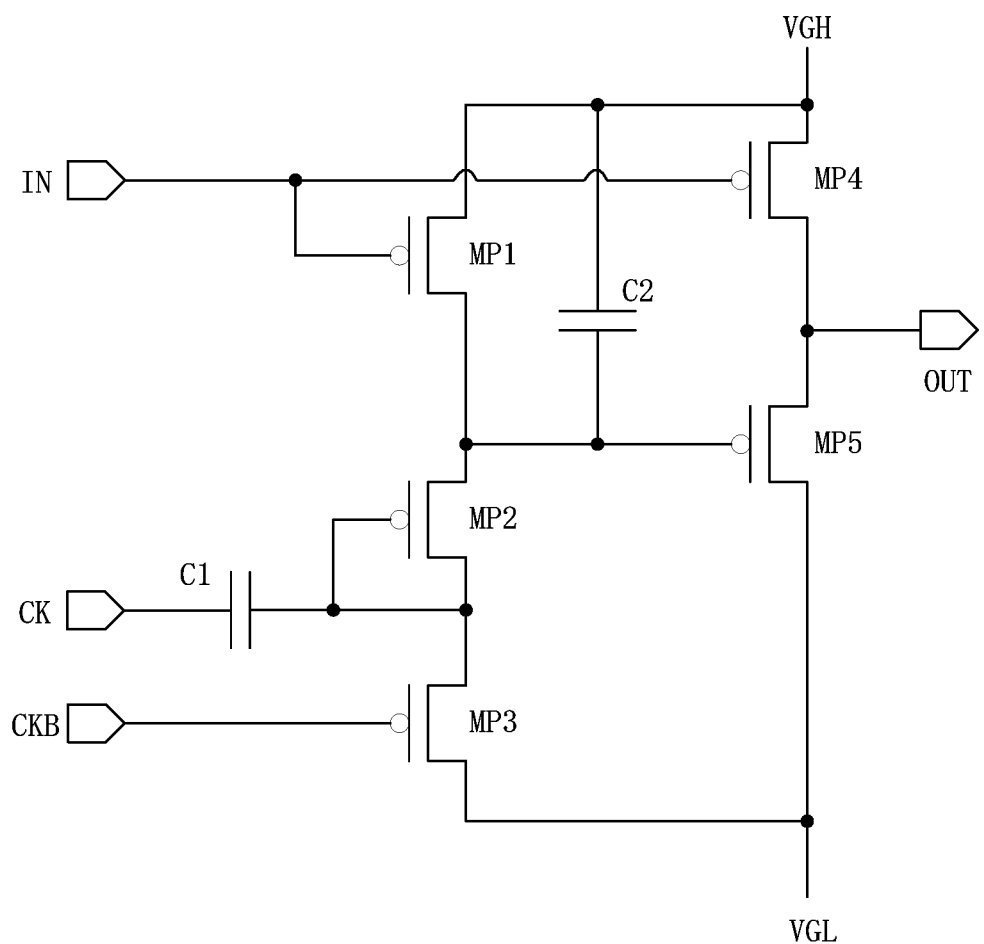
FIG. 4 is a circuit diagram of another inverter according to the second embodiment of the disclosure.

Moreover, FIG. 2A is only a specific example showing an electrical connection of the gate electrode of the fifth transistor MP5 and the second capacitor. In another specific example, as shown in FIG. 4, the gate electrode of the fifth transistor MP5 is electrically connected with the first electrical level signal input terminal VGH via the second capacitor C2, in this case, the operation stages of the inverter shown in FIG. 4 are the same as those of the inverter shown in FIG. 2A. However, compared with the inverter shown in FIG. 2A, in the third stage T3 of the inverter shown in FIG. 4, the electrical potential at the gate electrode of the fifth transistor MP5 will not be lowered even if the output signal OUTS changes from a high-level to a low-level.

Third Embodiment

Figure 5A:
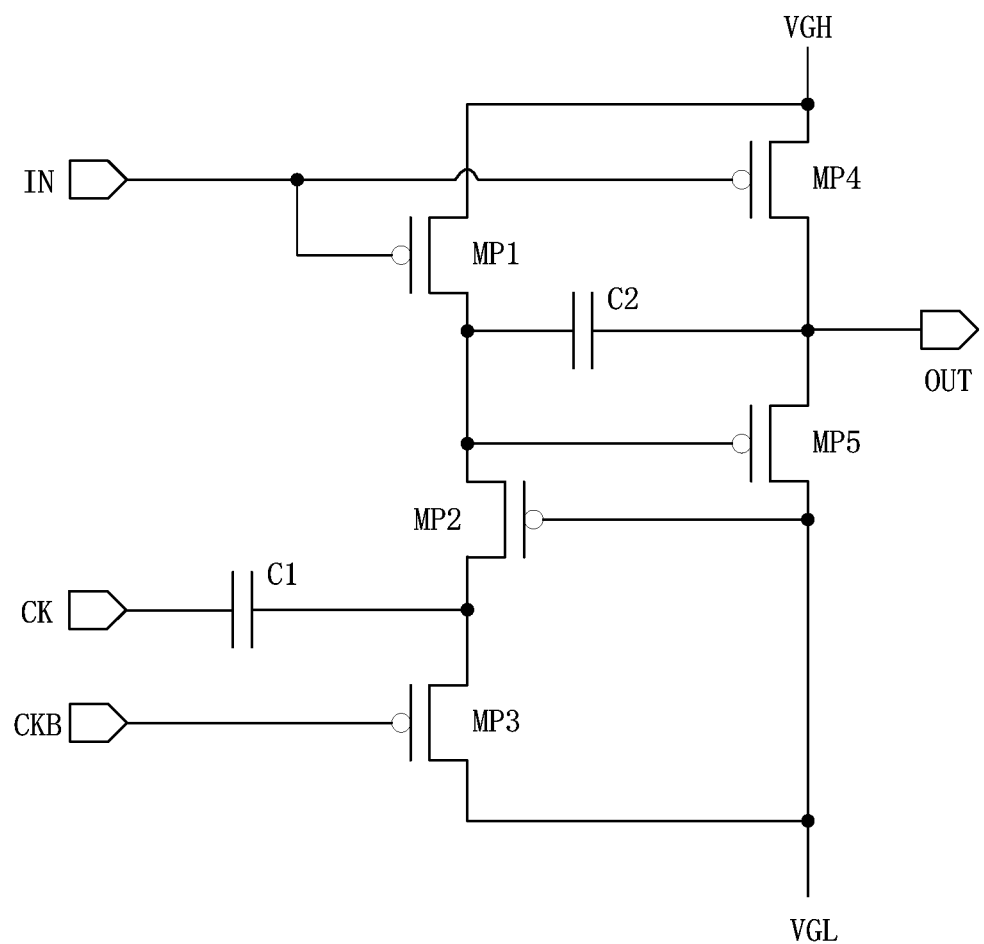
FIG. 5A is a circuit diagram of an inverter according to a third embodiment of the disclosure.

FIG. 5A is a circuit diagram of an inverter according to a third embodiment of the disclosure. As shown in FIG. 5A, an inverter in the third embodiment of the disclosure includes a first transistor MP1, a second transistor MP2, a third transistor MP3, a fourth transistor MP4, a fifth transistor MP5, a first capacitor C1 and a second capacitor C2. A gate electrode of the first transistor MP1 is electrically connected with an initial signal input terminal IN for receiving an initial signal, a source electrode of the first transistor MP1 is electrically connected with a first electrical level signal input terminal VGH for receiving a first electrical level signal, and a drain electrode of the first transistor MP1 is electrically connected with a source electrode of the second transistor MP2 and a gate electrode of the fifth transistor MP5.

A gate electrode of the second transistor MP2 is electrically connected with the second electrical level signal input terminal VGL, and the drain electrode of the second transistor MP2 is electrically connected, via the first capacitor C1, with a first clock signal input terminal CK for receiving a first clock signal. A gate electrode of the third transistor MP3 is electrically connected with a second clock signal input terminal CKB for receiving a second clock signal, a source electrode of the third transistor MP3 is electrically connected with the drain electrode of the second transistor MP2, and a drain electrode of the third transistor MP3 is electrically connected with the second electrical level signal input terminal VGL for receiving a second electrical level signal.

A gate electrode of the fourth transistor MP4 is electrically connected with the initial signal input terminal IN, a source electrode of the fourth transistor MP4 is electrically connected with the first electrical level signal input terminal VGH, and a drain electrode of the fourth transistor MP4 is electrically connected with an output terminal OUT for outputting an output signal. A gate electrode of the fifth transistor MP5 is electrically connected with the output terminal OUT via the second capacitor C2, a source electrode of the fifth transistor MP5 is electrically connected with the output terminal OUT, and a drain electrode of the fifth transistor MP5 is electrically connected with the second electrical level signal input terminal VGL.

As shown in FIG. 5A, in the third embodiment based on the first embodiment, the gate electrode of the second transistor MP2 is electrically connected with the second electrical level signal input terminal VGL, so that the second transistor MP2 is continuously turned on, and therefore reverse conduction of the second transistor MP2 may be prevented; further, the gate electrode of the fifth transistor MP5 is electrically connected with the output terminal OUT via the second capacitor C2, so that the electrical potential at the gate electrode of the fifth transistor MP5 is maintained via the second capacitor C2.

Figure 5B:
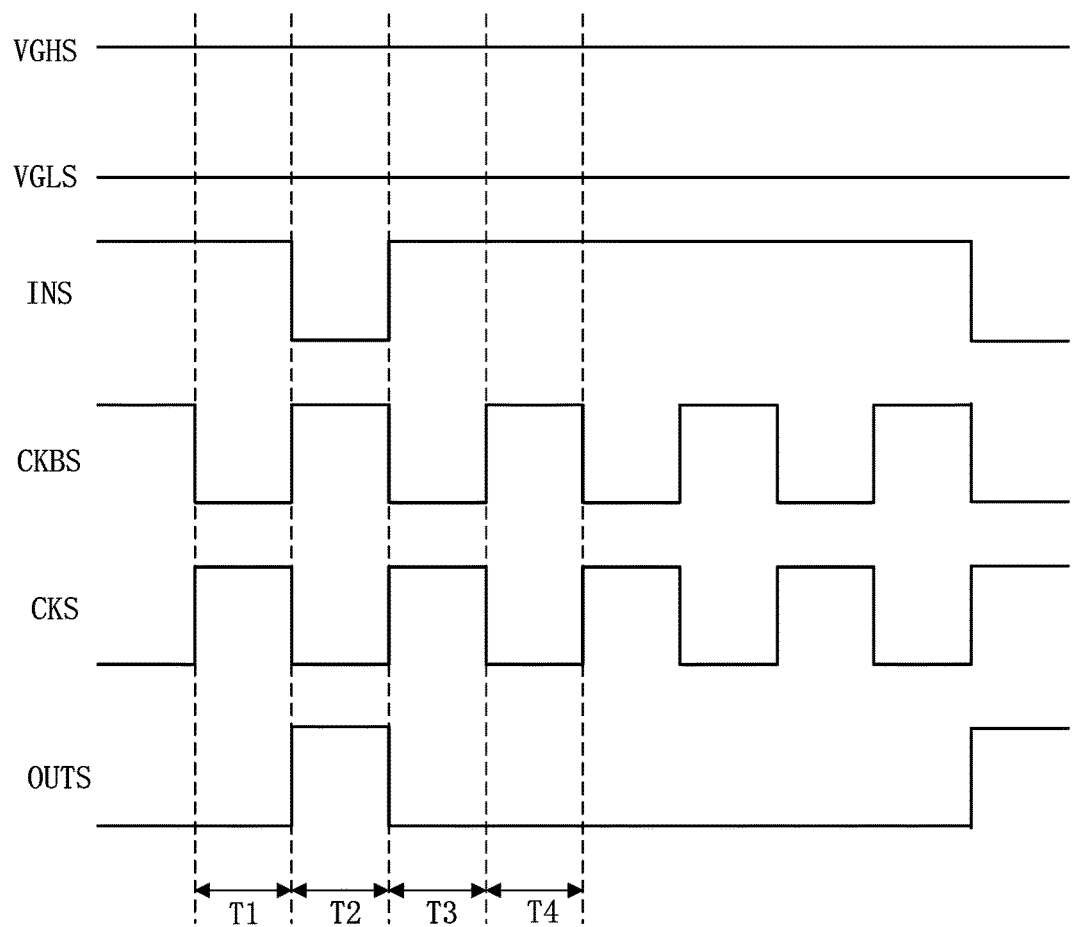
FIG. 5B is a diagram showing waveforms of various signals of the inverter shown in FIG. 5A.

FIG. 5B is a diagram showing waveforms of various signals of the inverter shown in FIG. 5A. As shown in FIG. 5B, INS represents the initial signal, CKS represents the first clock signal, CKBS represents the second clock signal, VGHS represents the first electrical level signal, VGLS represents the second electrical level signal, and OUTS represents the output signal. It should be noted that, in FIG. 5B, the first electrical level signal VGHS is a constant high-level signal, and the second electrical level signal VGLS is a constant low-level signal.

Figure 6A:
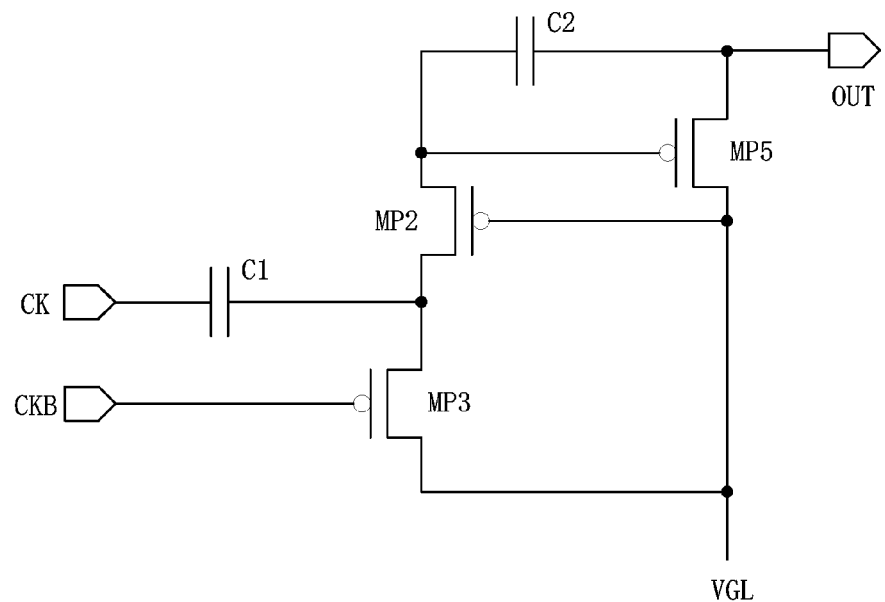
FIGS. 6A to 6C are equivalent circuit diagrams of the inverter shown in FIG. 5A corresponding to various stages shown in FIG. 5B.
Figure 6B:
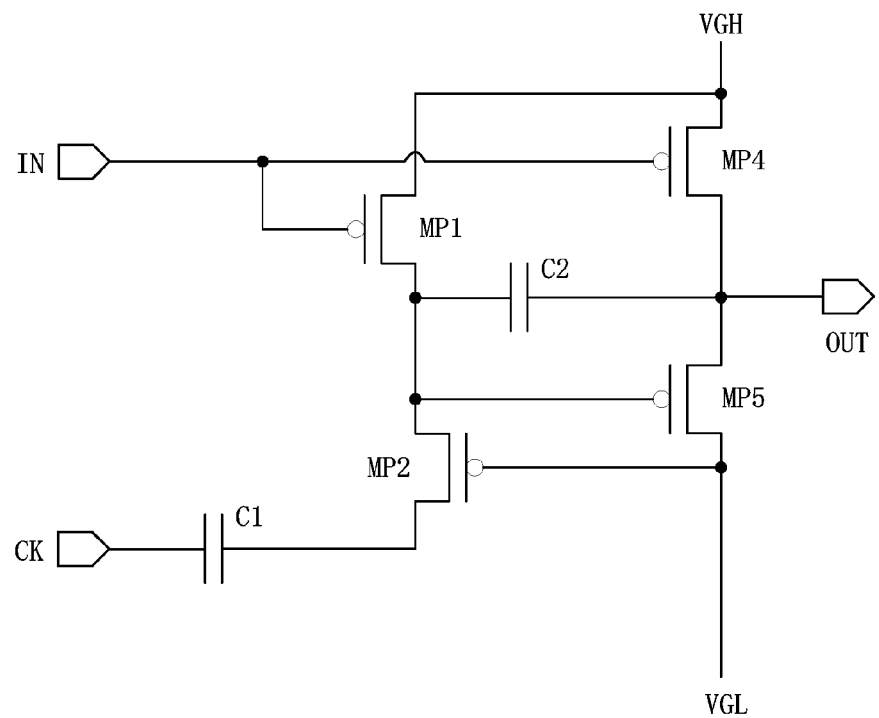
Figure 6C:
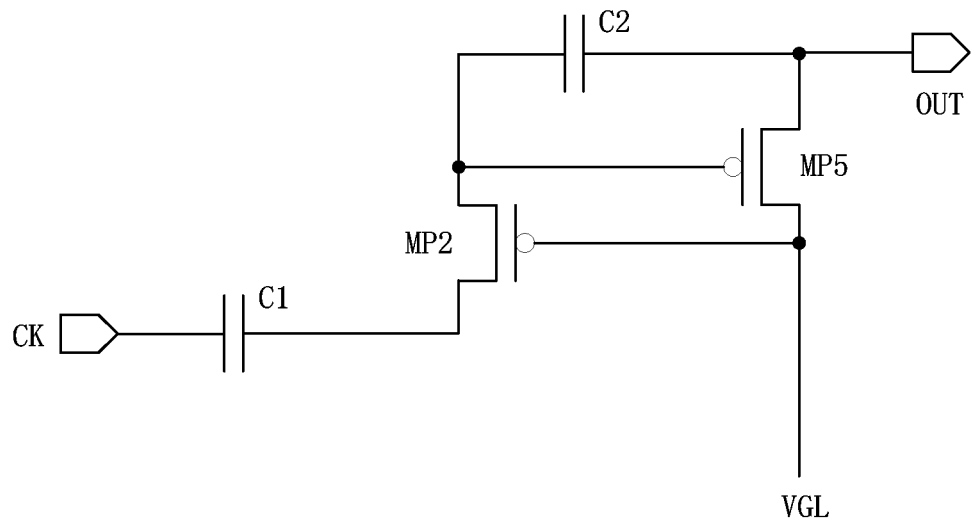

FIGS. 6A to 6C are equivalent circuit diagrams of the inverter shown in FIG. 5A corresponding to various stages shown in FIG. 5B. See FIGS. 5B and 6A to 6C, the working status of the inverter includes a first stage T1, a second stage T2, a third stage T3 and a fourth stage T4.

At the first stage T1, as shown in FIGS. 5B and 6A, the initial signal INS has a high-level to turn off the first transistor MP1 and the fourth transistor MP4, the second clock signal CKBS has a low-level to turn on the third transistor MP3, the second electrical level signal VGLS has a low-level and controls the second transistor MP2 to turn on, the second electrical level signal VGLS is transmitted to the gate electrode of the fifth transistor MP5 via the third transistor MP3 and the second transistor MP2 in turn to control the fifth transistor MP5 to turn on, so that the second electrical level signal VGLS is transmitted to the output terminal OUT via the fifth transistor MP5 as an output signal OUTS of the first stage T1. In addition, the output signal OUTS of the first stage T1 is a low-level signal, which is inverse to the initial signal INS, therefore the function of the inverter is accomplished at the first stage T1.

At the second stage T2, as shown in FIG. 6B, the initial signal INS has a low-level to turn on the first transistor MP1 and the fourth transistor MP4, the first electrical level signal VGHS has a high-level and is transmitted to the gate electrode of the fifth transistor MP5 via the first transistor MP1 to turn off the fifth transistor MP5, the second electrical level signal VGLS has a low-level to keep the second transistor MP2 turned on, the second clock signal CKBS has a high-level to turn off the third transistor MP3, so that the first electrical level signal VGHS is transmitted to the output terminal OUT via the fourth transistor MP4 as an output signal OUTS of the second stage T2. In addition, the output signal OUTS of the second stage T2 is a high-level signal, which is inverse to the initial signal INS, therefore the function of the inverter is accomplished at the second stage T2.

At the third stage T3, as shown in FIG. 6A (the equivalent circuit diagram of the inverter at the third stage T3 is the same as that at the first stage T1), the initial signal INS has a high-level to turn off the first transistor MP1 and the fourth transistor MP4, the second clock signal CKBS has a low-level to turn on the third transistor MP3, the second electrical level signal VGLS has a low-level to keep the second transistor MP2 turned on, and the second electrical level signal VGLS is transmitted to the gate electrode of the fifth transistor MP5 via the third transistor MP3 and the second transistor MP2 to turn on the fifth transistor MP5, and then further transmitted to the output terminal OUT via the fifth transistor MP5 as an output signal OUTS of the third stage T3. In addition, the output signal OUTS of the third stage T3 is a low-level signal, which is inverse to the initial signal INS, therefore the function of the inverter is accomplished at the third stage T3.

It should be noted that, in the third stage T3, the second clock signal CKBS has a low-level to turn on the third transistor MP3, the second electrical level signal VGLS has a low-level and is transmitted to the gate electrode of the fifth transistor MP5 via the third transistor MP3 and the second transistor MP2. In addition, when the output signal OUTS changes from a high-level to a low-level, the electrical potential at the gate electrode of the fifth transistor MP5 is much lowered because of the Bootstrap effect of the second capacitor C2, thus ensuring that the fifth transistor MP5 is completely turned on and the output terminal OUT can completely output a low-level of the second electrical level signal VGLS. Therefore, when the first clock signal CKS changes from a low-level to a high-level, the first clock signal CKS will not affect the electrical potential at the gate electrode of the fifth transistor MP5, and hence will not affect a level value of the output signal OUTS at the output terminal OUT, so that the resultant output signal OUTS is stable.

At the fourth stage T4, as shown in FIG. 6C, the initial signal INS has a high-level to turn off the first transistor MP1 and the fourth transistor MP4, the second clock signal CKBS has a high-level to turn off the third transistor MP3, the second electrical level signal VGLS has a low-level to keep the second transistor MP2 turned on, the first clock signal CKS has a low-level and controls the electrical potential at the drain electrode of the second transistor MP2 via the first capacitor C1, the electrical potential at the drain electrode of the second transistor MP2 controls the electrical potential at the gate electrode of the fifth transistor MP5 via the second transistor MP2 to turn on the fifth transistor MP5, so that the second electrical level signal VGLS is transmitted to the output terminal OUT via the fifth transistor MP5 as an output signal OUTS of the fourth stage T4. In addition, the output signal OUTS of the fourth stage T4 is a low-level signal, which is inverse to the initial signal INS, therefore the function of the inverter is accomplished at the fourth stage T4.

It should be noted that, in the fourth stage T4, the initial signal INS has a high-level to turn off the first transistor MP1, the second clock signal CKBS has a high-level to turn off the third transistor MP3, and the electrical potential at the drain electrode of the second transistor MP2 become lower because of the Bootstrap effect of the first capacitor C1 when the first clock signal CKS changes from a high-level to a low-level, and the electrical potential at the gate electrode of the fifth transistor MP5 is low through the second transistor MP2 which is turned on; so that the fifth transistor MP5 continuously transmits the level value of the second electrical level signal VGLS to the output terminal OUT. Therefore, when the first clock signal CKS changes from a high-level to a low-level, a level value of the output signal OUTS of the output terminal OUT will not be affected, so that the resultant output signal OUTS is stable.

It can be seen from FIG. 5B that the inverter works alternately in the third stage T3 and the fourth stage T4 between two adjacent second stages T2. In addition, the output signal OUTS of the inverter of the second embodiment in the third stage T3 and the fourth stage T4 is not affected by the change of the first clock signal CKS, therefore the inverter of the second embodiment may obtain a stable output signals OUTS.

Figure 7:
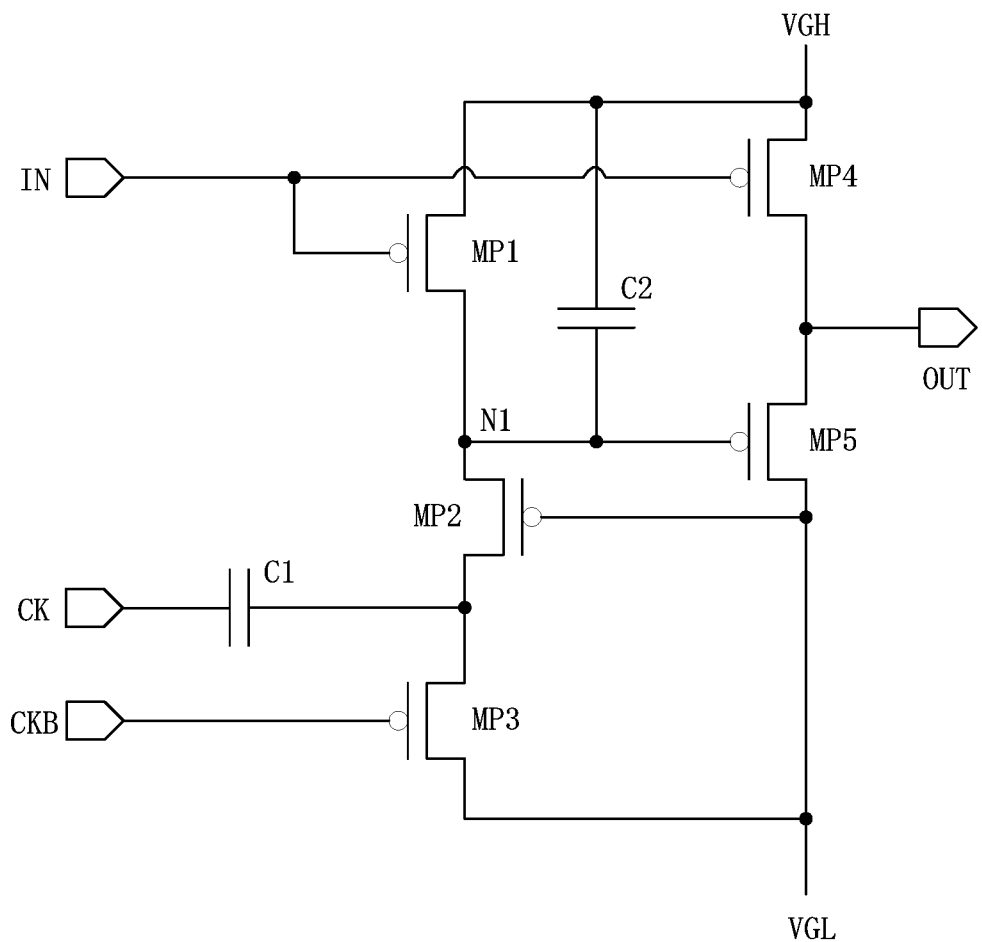
FIG. 7 is a circuit diagram of another inverter according to the third embodiment of the disclosure.

Moreover, FIG. 5A is only a specific example showing an electrical connection of the gate electrode of the fifth transistor MP5 and the second capacitor. In another specific example, as shown in FIG. 7, the gate electrode of the fifth transistor MP5 is electrically connected with the first electrical level signal input terminal VGH via the second capacitor C2, in this case, working status of the inverter shown in FIG. 7 is the same as that of the inverter shown in FIG. 5A. However, compared with the inverter shown in FIG. 5A, in the third stage T3 of the inverter shown in FIG. 7, the electrical potential at the gate electrode of the fifth transistor MP5 will not be lowered even if the output signal OUTS changes from a high-level to a low-level.

Fourth Embodiment

Figure 8:
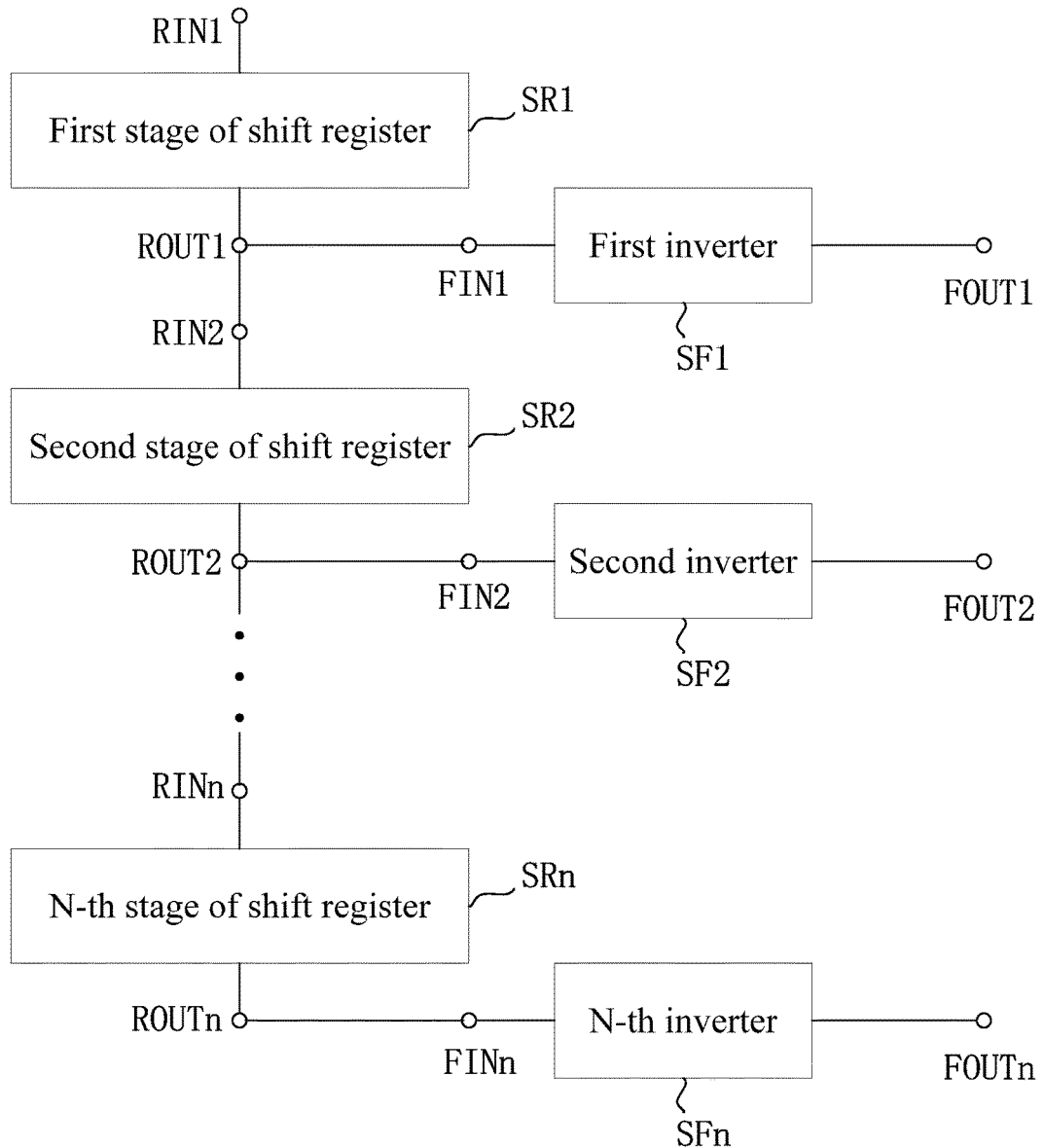
FIG. 8 is a schematic diagram of a structure of a driving circuit according to a fourth embodiment of the disclosure.

The fourth embodiment of the disclosure provides a driving circuit. FIG. 8 is a schematic diagram of a structure of a driving circuit according to the fourth embodiment of the disclosure. As shown in FIG. 8, the driving circuit may include n stages of shift registers and n inverters, where n is an integer greater than 1. The n stages of shift registers include a first stage of shift register, a second stage of shift register, . . . , an n-th stage of shift register (SR1 to SRn), and the n inverters include a first inverter, a second inverter, . . . , an n-th inverter (SF1 to SFn). Each stage of the shift register has an input terminal (with all the input terminals of the stages of shift registers being represented by RIN1 to RINn, respectively) and an output terminal (with all the output terminals of the stages of shift registers being represented by ROUT1 to ROUTn, respectively), and each inverter has an input terminal (with all the input terminals of the inverters being represented by FIN1 to FINn, respectively) and an output terminal (with al the output terminals of the inverters being represented by FOUT1 to FOUTn, respectively); an input terminal RIN1 of the first stage of shift register SR1 is used as an input terminal of the driving circuit.

Starting from the second stage of shift register SR2, an input terminal of each stage of shift register is electrically connected with an output terminal of the immediately preceding stage of shift register, and an output terminal ROUTi of each i-th stage of shift register is electrically connected with an input terminal FINi of the i-th inverter, where 1≤i≤n. The output terminal of each of the n inverters is used as a corresponding output terminal of the driving circuit, and the inverter is configured to invert an output signal of the shift register electrically connected with the inverter, and output the obtained inverted signal as an output signal of the driving circuit. Here, the n inverters of the fourth embodiment are the inverters mentioned in any of the first to third embodiments.

The driving circuit provided in the fourth embodiment of the disclosure adopts inverters with stable output signals, therefore the driving circuit can output stable output signals.

Fifth Embodiment

Figure 9A:
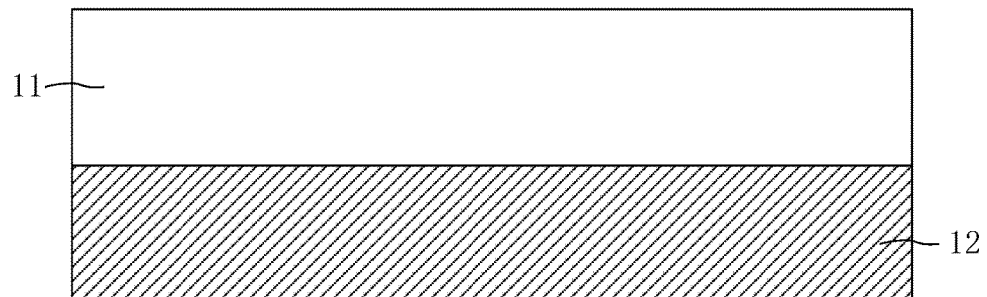
FIG. 9A is a schematic diagram of a structure of a display panel according to a fifth embodiment of the disclosure.

The fifth embodiment of the disclosure provides a display panel. FIG. 9A is a schematic diagram of a structure of a display panel according to in the fifth embodiment of the disclosure. As shown in FIG. 9A, the display panel in the fifth embodiment includes a first substrate 11, and a second substrate 12 arranged opposite to the first substrate 11, where the first substrate 11 may be a color filter substrate, a cover glass, a cover lens or the like, and the second substrate 12 may be a pixel array substrate.

Figure 9B:
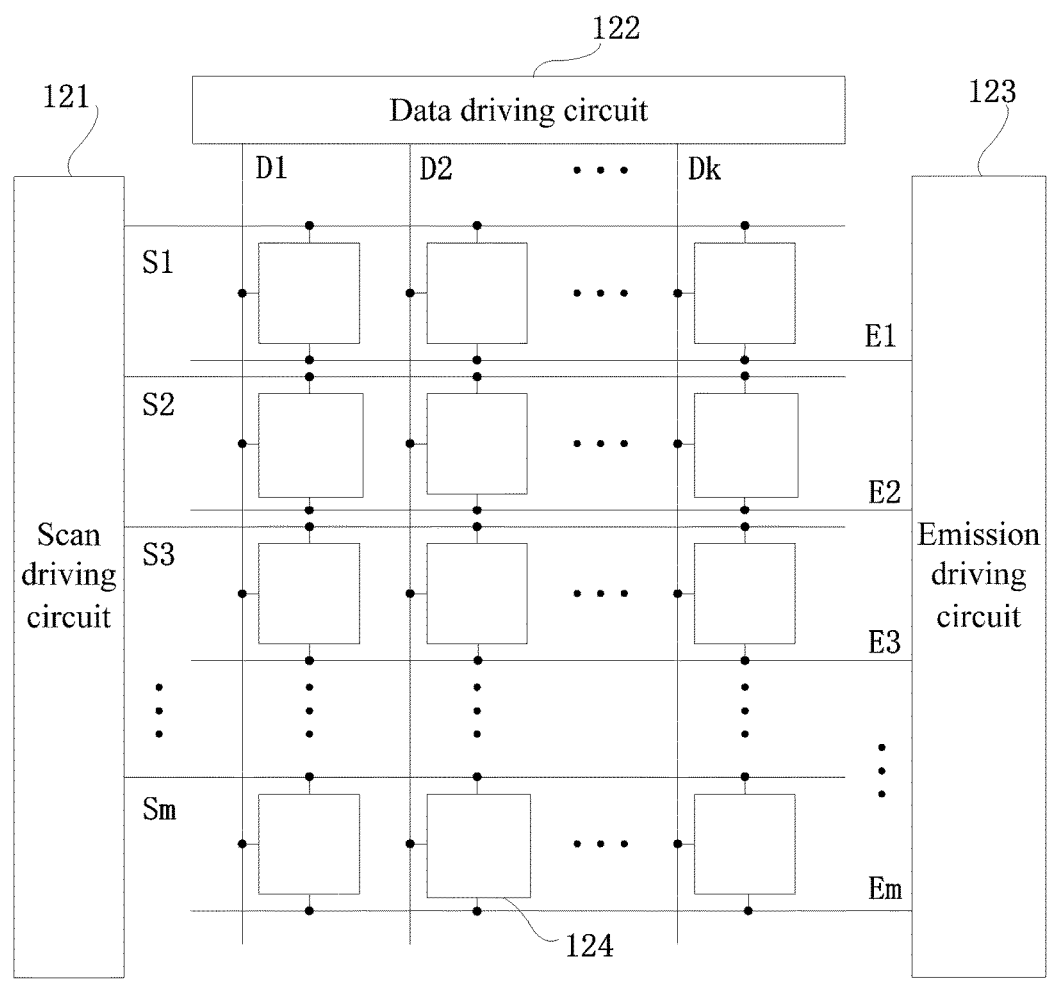
FIG. 9B is a schematic diagram of a structure of a second substrate according to a fifth embodiment of the disclosure.

FIG. 9B is a schematic diagram of a structure of the second substrate according to the fifth embodiment of the disclosure. As shown FIG. 9B, if the second substrate is a pixel array substrate, the second substrate may include a scan driving circuit 121, a data driving circuit 122, an emission driving circuit 123, m scanning lines (S1, S2, . . . , Sm), k data lines (D1, D2, . . . , Dk), m emission driving lines (E1, E2, . . . , Em) and a plurality of pixels 124, where the emission driving circuit 123 in the fifth embodiment is the driving circuit mentioned in the fourth embodiment and is not reiterated in the fifth embodiment.

Specifically, in the fifth embodiment, the scan driving circuit 121 is configured to provide scanning signals for the various scanning lines (S1, S2, . . . , Sm), the data driving circuit 122 is configured to provide data signals for the various data lines (D1, D2, . . . , Dk), and the emission driving circuit 123 is configured to provide emission driving signals for the various emission driving lines (E1, E2, . . . , Em), to implement the node initialization, threshold value compensation, data writing and the like by a pixel compensation circuit in the pixel 124; the pixels 124 are respectively arranged in areas formed by intersecting the scanning lines with the data lines.

By adopting the driving circuit with stable output signals on the second substrate of the display panel, the display panel provided in the fifth embodiment of the disclosure may enable pixels on the second substrate to operate stably, thus obtaining a better display effect of the corresponding display panel.

In the above disclosed inverters based on the first embodiments, the first transistor may have a substantially large drain-source voltage $V_{DS}$ when the first transistor is turned off. For example, referring to FIGS. 2A and 2B, assume the value of a high-level of the initial signal, the output signal, the first clock signal and the second clock signal is set to be 10V, the value of a low-level of the initial signal, the output signal, the first clock signal and the second clock signal is set to be −5V, the first electrical level signal is a high-level signal which has a level of 8V, and the second electrical level signal is a low-level signal which has a level of −7V.

Then when the initial signal INS has a high-level to turn off the first transistor MP1 and the output signal OUTS is a low-level signal (i.e., in the first stage T1, the third stage T3, and the fourth stage T4), the voltage at the node N1 is calculated to be approximately −17V through simulation and, accordingly, the drain-source voltage $V_{DS}$ of the first transistor is approximately 25V (i.e., $V_{DS}$=VGH−N1=8V+17V=25V).

Such a large drain-source voltage $V_{DS}$ when the first transistor MP1 is normally OFF may result a significant leakage current flowing between the drain and the source of first transistor MP1, i.e., a significant drain-source leakage current, which may consume power even when first transistor MP1 is normally OFF and limit the amount of time that data is retained. Moreover, such a significant drain-source leakage current may cause a failure of the first transistor MP1. As a result, the first electrical level signal VGH may be transmitted to the gate electrode of the fifth transistor MP5 to turn off the fifth transistor MP5, and the inverter may not function properly.

To solve one or more problems set forth above, the present disclosure further provides an improved inverter, in which a sixth transistor is introduced to reduce the drain-source voltage $V_{DS}$ when the first transistor MP1 is turned off. The improved inverter may not only provide a stable output signal when the first clock signal changes from a low-level to a high-level, but also eliminate the inverter malfunction due to the failure of the first transistor and improve the reliability of the inverter.

Sixth Embodiment

The sixth embodiment of the disclosure provides an inverter, including a first transistor, a second transistor, a third transistor, a fourth transistor, a fifth transistor, a sixth transistor, a first capacitor and a second capacitor. A gate electrode of the first transistor is electrically connected with an initial signal input terminal for receiving an initial signal, a source electrode of the first transistor is electrically connected with a second clock signal input terminal for receiving a second clock signal, and a drain electrode of the first transistor is electrically connected with a source electrode of the sixth transistor.

A drain electrode of the second transistor is electrically connected, via the first capacitor, with a first clock signal input terminal for receiving a first clock signal.

A gate electrode of the third transistor is electrically connected with the second clock signal input terminal for receiving the second clock signal, a source electrode of the third transistor is electrically connected with the drain electrode of the second transistor, and a drain electrode of the third transistor is electrically connected with a second electrical level signal input terminal for receiving a second electrical level signal.

A gate electrode of the fourth transistor is electrically connected with the initial signal input terminal, a source electrode of the fourth transistor is electrically connected with a first electrical level signal input terminal, and a drain electrode of the fourth transistor is electrically connected with an output terminal for outputting an output signal.

A source electrode of the fifth transistor is electrically connected with the output terminal, and a drain electrode of the fifth transistor is electrically connected with the second electrical level signal input terminal.

A gate electrode of the sixth transistor is electrically connected with the first clock signal input terminal for receiving the first clock signal, a drain electrode of the sixth transistor is electrically connected with the output terminal via the second capacitor, and the drain electrode of the sixth transistor is also electrically connected with the gate electrode of the fifth transistor.

The second transistor has its gate electrode controlled in such a way to prevent reverse conduction of the second transistor. The second capacitor is configured to maintain the electrical potential at the gate electrode of the fifth transistor, and the initial signal and the output signal are inverse to each other.

In addition to the implementation of the invertor function based on the various transistors and capacitors included in the inverter, the reverse conduction of the second transistor is prevented by controlling the gate electrode of the second transistor, and the electrical potential at the gate electrode of the fifth transistor is maintained by the second capacitor. When the first clock signal changes from a high-level to a low-level (in the case where the first to sixth transistors are all NMOS transistors) or from a low-level to a high-level (in the case where the first to sixth transistors are all PMOS transistors), the electrical potential at the gate electrode of the fifth transistor may be maintained stable. Thus, the output signal of the inverter may not be affected by the change of the first clock signal, thus enabling the inverter to generate a stable output signal.

Further, the sixth transistor is configured to reduce the drain-source voltage $V_{DS}$ when the first transistor is turned off. Thus, the corresponding drain-source leakage current of the first transistor may be reduced, the inverter malfunction due to the failure of the first transistor may be eliminated, and the reliability of the inverter may be improved.

Further, the first transistor, the second transistor, the third transistor, the fourth transistor, the fifth transistor, and the sixth transistor are all NMOS transistors or PMOS transistors. In following various embodiments regarding the inverter, description is made by an example where all the transistors are PMOS transistors. However, it is understood that all the transistors may be NMOS transistors, where high-levels of various signals correspond to low-levels of the signals in the case where all the transistors are PMOS transistors, and low-levels of various signals correspond to high-levels of the signals in the case where all the transistors are PMOS transistors.

Further, the initial signal, the output signal, the first clock signal and the second clock signal are all pulse signals, where the first clock signal and the second clock signal are inverse to each other. It should be noted that the value of a high-level of the initial signal, the output signal, the first clock signal and the second clock signal may be set at 10V, and the value of a low-level thereof may be set at −5V, or may be set at other values according to the types of the transistors and actual requirements.

Further, both the first electrical level signal and the second electrical level signal are constant. It should be noted that when the first to sixth transistors are all PMOS transistors, the first electrical level signal is a high-level signal which may have a level of 8V, and the second electrical level signal is a low-level signal which may have a level of −7V. Similarly, when the first to sixth transistors are all NMOS transistors, the first electrical level signal is a low-level signal which may have a level of −7V, and the second electrical level signal is a high-level signal which may have a level of 8V. In practical applications, the level of the first electrical level signal and the second electrical level signal may be set at other values according to actual requirements.

Based on the above-described principles, given that the function of the inverter can be achieved, the circuit structure of the inverter, including for example a position at which the gate electrode of the second transistor is electrically connected and a position at which the second capacitor is electrically connected, may be implemented in various ways, as long as the output signal of the inverter is not affected by the change of the first clock signal and maintains stable when the first clock signal changes from a low-level to a high-level (in the case of description below made by taking an example where the first to sixth transistors are all PMOS transistors). Certain embodiments are illustrated in detail below.

Seventh Embodiment

Figure 10A:
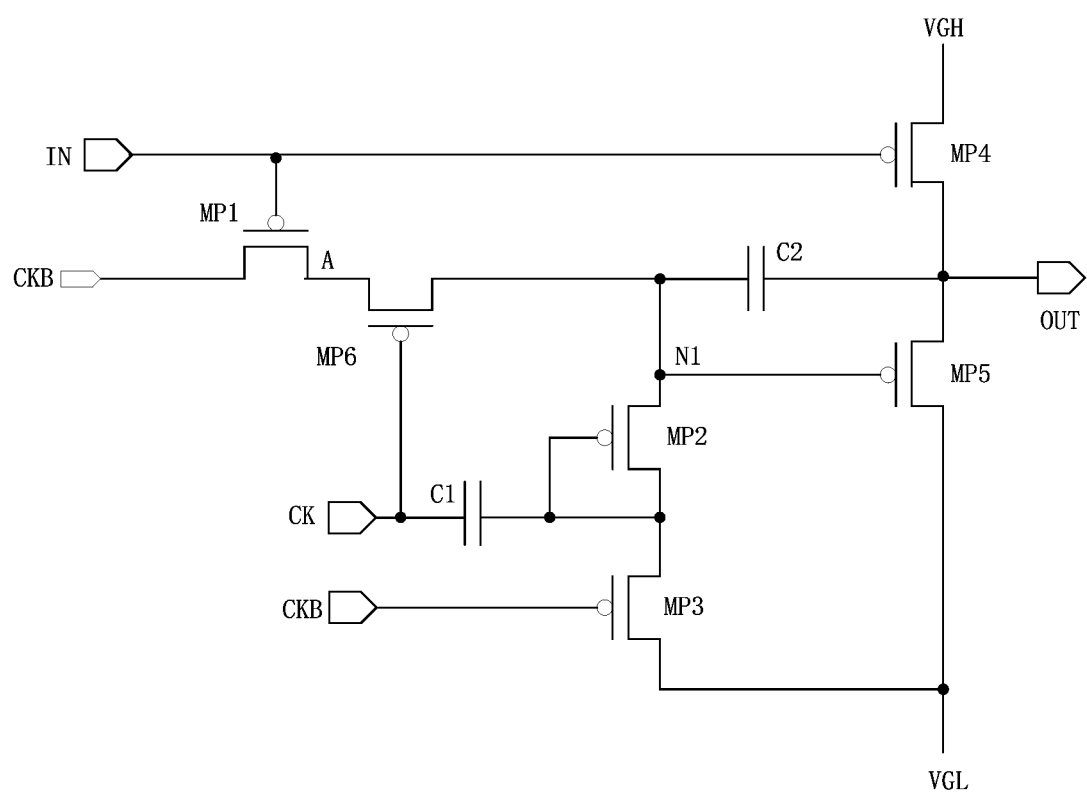
FIG. 10A is a circuit diagram of an inverter according to a seventh embodiment of the disclosure.

FIG. 10A is a circuit diagram of an inverter according to a seventh embodiment of the disclosure. As shown in FIG. 10A, an inverter includes a first transistor MP1, a second transistor MP2, a third transistor MP3, a fourth transistor MP4, a fifth transistor MP5, a sixth transistor MP6, a first capacitor C1 and a second capacitor C2.

A gate electrode of the first transistor MP1 is electrically connected with an initial signal input terminal IN for receiving an initial signal, a source electrode of the first transistor MP1 is electrically connected with a second clock signal input terminal CKB for receiving a second clock signal, and a drain electrode of the first transistor MP1 is electrically connected with a source electrode of the sixth transistor MP6.

A gate electrode of the second transistor MP2 is electrically connected with a drain electrode of the second transistor MP2, and the drain electrode of the second transistor MP2 is further electrically connected, via the first capacitor C1, with a first clock signal input terminal CK for receiving a first clock signal.

A gate electrode of the third transistor MP3 is electrically connected with the second clock signal input terminal CKB for receiving the second clock signal, a source electrode of the third transistor MP3 is electrically connected with the drain electrode of the second transistor MP2, and a drain electrode of the third transistor MP3 is electrically connected with a second electrical level signal input terminal VGL for receiving a second electrical level signal.

A gate electrode of the fourth transistor MP4 is electrically connected with the initial signal input terminal IN, a source electrode of the fourth transistor MP4 is electrically connected with the first electrical level signal input terminal VGH, and a drain electrode of the fourth transistor MP4 is electrically connected with an output terminal OUT for outputting an output signal.

A gate electrode of the fifth transistor MP5 is electrically connected with the output terminal OUT via the second capacitor C2, a source electrode of the fifth transistor MP5 is electrically connected with the output terminal OUT, and a drain electrode of the fifth transistor MP5 is electrically connected with the second electrical level signal input terminal VGL.

A gate electrode of the sixth transistor MP6 is electrically connected with the first clock signal input terminal CK for receiving the first clock signal, a drain electrode of the sixth transistor MP6 is electrically connected with the output terminal OUT via the second capacitor C2, and the drain electrode of the sixth transistor MP6 is also electrically connected with the gate electrode of the fifth transistor MP5.

Based on the above-described sixth embodiment, the reverse conduction of the second transistor MP2 is prevented by electrically connecting the gate electrode of the second transistor MP2 with the drain electrode of the second transistor MP2 to form a diode, and the electrical potential at the gate electrode of the fifth transistor MP5 is maintained through the second capacitor C2 by electrically connecting the gate electrode of the fifth transistor MP5 with the output terminal OUT via the second capacitor C2.

Figure 10B:
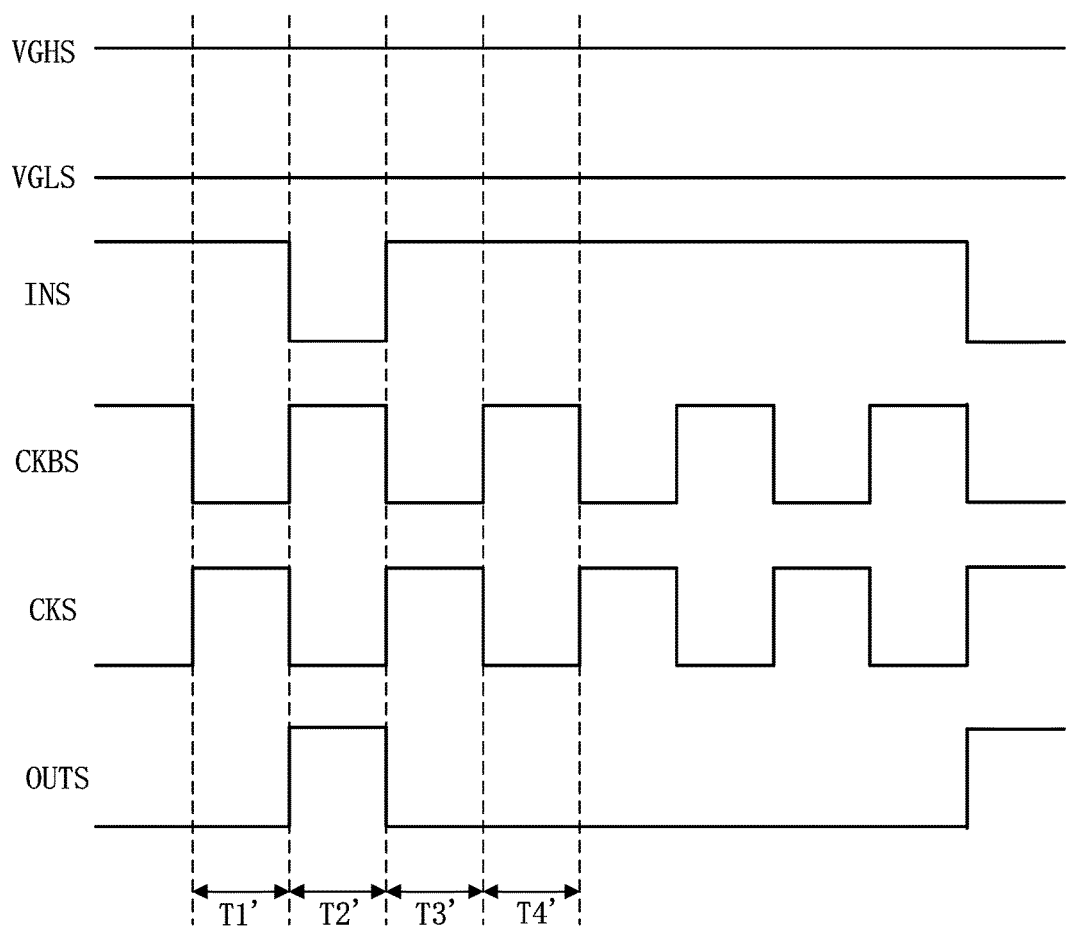
FIG. 10B is a diagram showing waveforms of various signals of the inverter shown in FIG. 10A.

FIG. 10B is a diagram showing waveforms of various signals of the inverter shown in FIG. 10A. As shown in FIG. 10B, INS represents the initial signal, CKS represents the first clock signal, CKBS represents the second clock signal, VGHS represents the first electrical level signal, VGLS represents the second electrical level signal, and OUTS represents the output signal. It should be noted that, in FIG. 10B, the first electrical level signal VGHS is a constant high-level signal, and the second electrical level signal VGLS is a constant low-level signal.

Figure 11A:
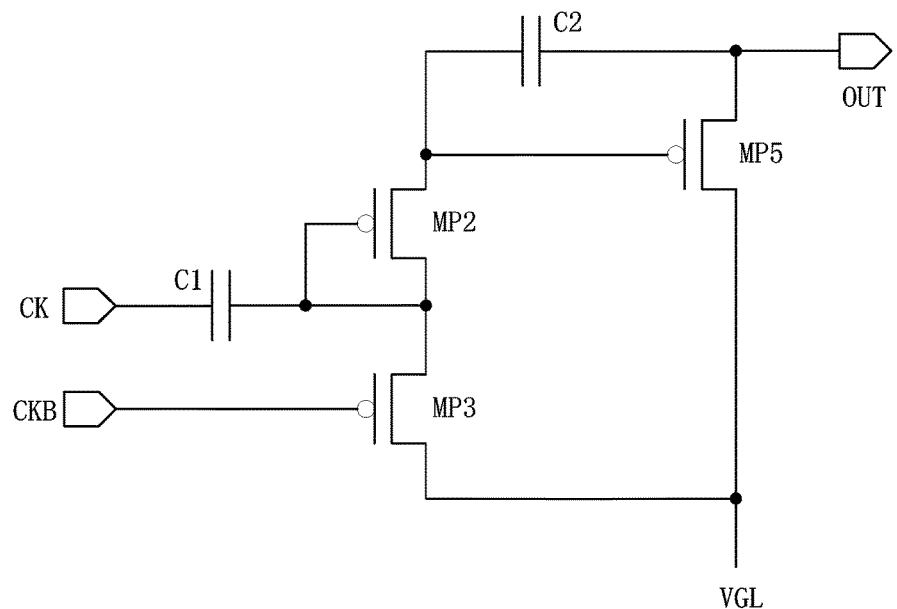
FIGS. 11A to 11C are equivalent circuit diagrams of the inverter shown in FIG. 10A corresponding to various stages shown in FIG. 10B.
Figure 11B:
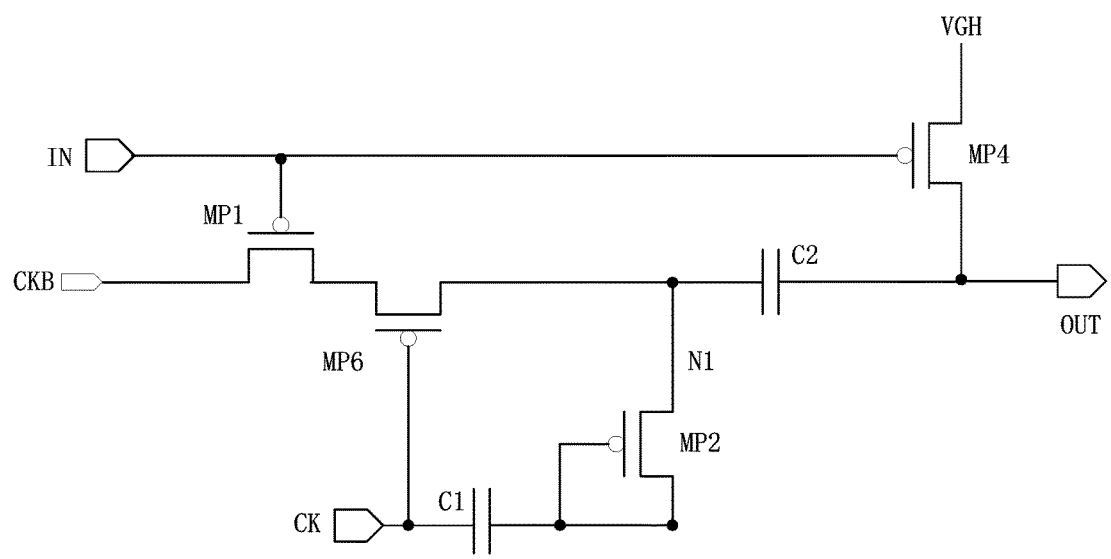
Figure 11C:
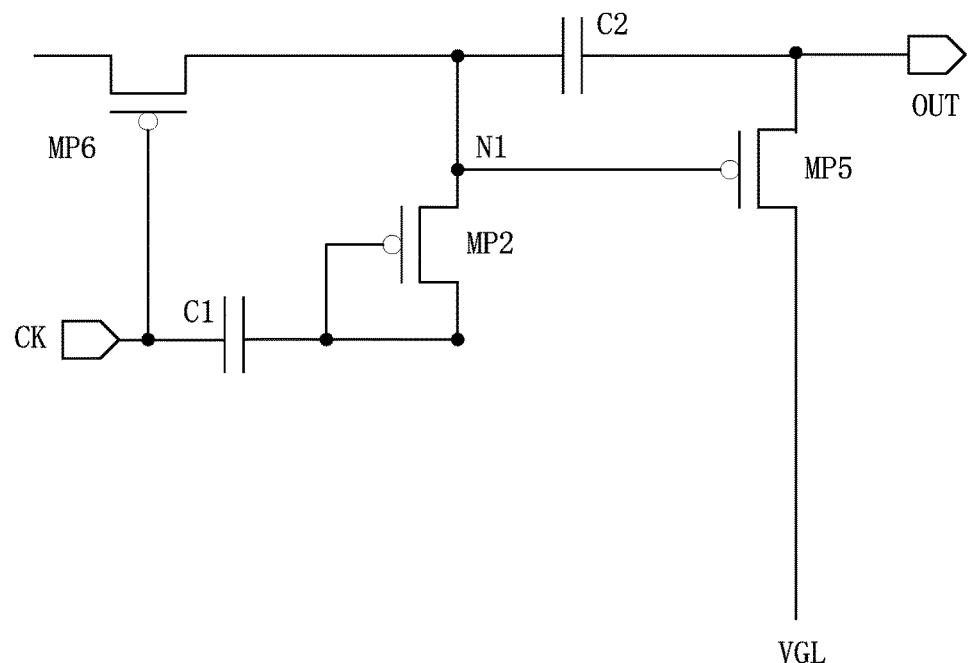

FIGS. 11A to 11C are equivalent circuit diagrams of the inverter shown in FIG. 10A corresponding to various stages shown in FIG. 10B. Referring to FIGS. 10B and 11A to 11C, the inverter may have four operation stages including a first stage T1', a second stage T2', a third stage T3' and a fourth stage T4'.

At the first stage T1', as shown in FIGS. 10B and 11A, the initial signal INS has a high-level to turn off the first transistor MP1 and the fourth transistor MP4, and the first clock signal CKS has a high-level to turn off the sixth transistor MP6. The second clock signal CKBS has a low-level to turn on the third transistor MP3, and the second electrical level signal VGLS has a low-level and is transmitted to the gate electrode of the second transistor MP2 via the third transistor MP3 to turn on the second transistor MP2.

Then the second electrical level signal VGLS is further transmitted to the gate electrode of the fifth transistor MP5 via the second transistor MP2 to turn on the fifth transistor MP5, such that the second electrical level signal VGLS is transmitted to the output terminal OUT via the fifth transistor MP5 as an output signal OUTS of the first stage T1'. In addition, the output signal OUTS of the first stage T1' is a low-level signal, which is inverse to the initial signal INS, therefore the function of the inverter is accomplished at the first stage T1'.

Figure 16:
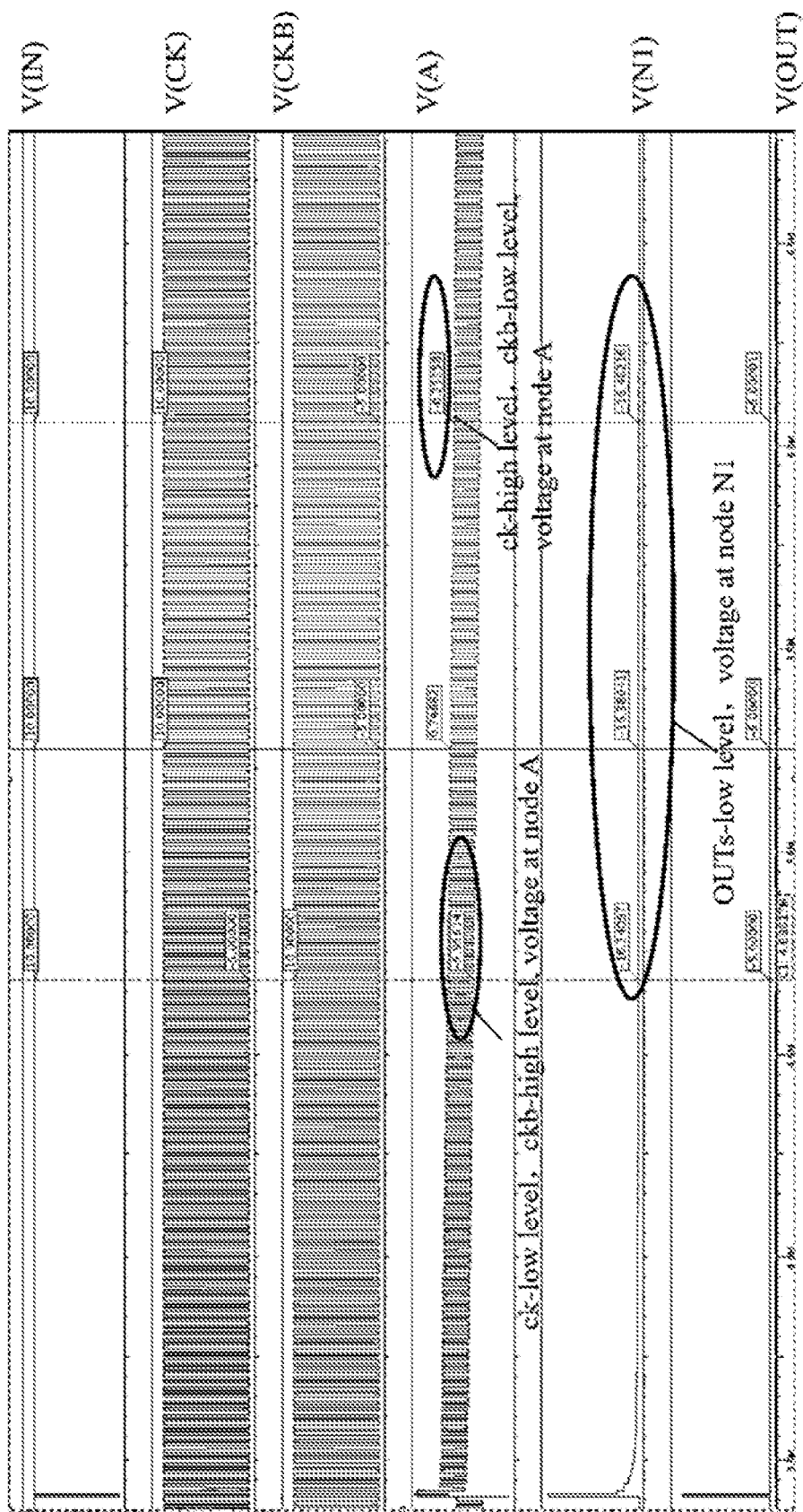
FIG. 16 is a diagram showing simulated waveforms of various signals of the inverter shown in FIG. 12A.

Further, as shown in FIGS. 10A and 10B, in the first stage T1', the first transistor MP1 and the sixth transistor MP6 are both turned off. According to the simulation results in FIG. 16, the voltage at the node N1 (i.e., the voltage at the gate electrode of the third transistor MP3) is approximately −17V. Thus, the sum of the drain-source voltage $V_{DS}$ of the first transistor MP1 and the drain-source voltage $V_{DS}$ of the sixth transistor MP6 is approximately 12V (i.e., CKB−N1=−5V+17V=12V)

Compared to the inverter without the sixth transistor shown in FIG. 2A, the sixth transistor MP6 in the inverter shown in FIG. 10A may significantly reduce the drain-source voltage $V_{DS}$ of the first transistor MP1. For example, the sum of the drain-source voltage $V_{DS}$ of the first transistor MP1 and the drain-source voltage $V_{DS}$ of the sixth transistor MP6 is approximately 12V. Assume the first transistor MP1 and the sixth transistor MP6 have similar characteristics, the drain-source voltage $V_{DS}$ of the first transistor MP1 may be reduced to approximately 6V, while the drain-source voltage $V_{DS}$ of the first transistor MP1 in FIG. 2A is approximately 25V.

Thus, the corresponding drain-source leakage current of the first transistor MP1 may be significantly reduced, while the drain-source leakage current of the sixth transistor MP6 may be still substantially small, for example, comparable to the drain-source leakage current of the first transistor MP1. Thus, the first transistor MP1 and the sixth transistor MP6 may be effectively protected from failure due to a substantially large drain-source leakage current. Accordingly, the inverter malfunction due to the failure of the first transistor MP1 and the sixth transistor MP6 may be eliminated, and the reliability of the inverter may be significantly improved.

At the second stage T2', as shown in FIGS. 10B and 11B, the initial signal INS has a low-level to turn on the first transistor MP1 and the fourth transistor MP4, and the first clock signal CKB has a low-level to turn on the sixth transistor MP6. The second clock signal CKBS has a high-level and is transmitted to the gate electrode of the fifth transistor MP5 via the first transistor MP1 and the sixth transistor MP6 to turn off the fifth transistor MP5.

The second clock signal CKBS has a high-level to turn off the third transistor MP3, and the first electrical level signal VGHS is transmitted to the output terminal OUT via the fourth transistor MP4 as an output signal OUTS of the second stage T2'. In addition, the output signal OUTS of the second stage T2' is a high-level signal, which is inverse to the initial signal INS, therefore the function of the inverter is accomplished at the second stage T2'.

It should be noted that, in the second stage T2', the second clock signal CKBS has a high-level to turn off the third transistor MP3. Since the first clock signal CKS in the second stage T2' has a low-level, the electrical potential at the gate electrode of the second transistor MP2 is lowered because of the Bootstrap effect of the first capacitor C1 (i.e. electric charge of the first capacitor C1 is conserved), such that the second transistor MP2 is turned on. The second clock signal CKBS has a high-level and charges the gate electrode of the second transistor MP2 through the first transistor MP1, the sixth transistor MP6 and the second transistor M2, such that that the second transistor MP2 is turned off when the electrical potential at the gate electrode of the second transistor MP2 rapidly reaches a difference between the gate electrode voltage of the fifth transistor MP5 and an absolute value of a threshold voltage of the second transistor MP2, and in the meantime, the electrical potential at the gate electrode of the fifth transistor MP5 remains at a high-level.

At the third stage T3', as shown in FIG. 11A (the equivalent circuit diagram of the inverter at the third stage T3' is the same as that at the first stage T1'), the initial signal INS has a high-level to turn off the first transistor MP1 and the fourth transistor MP4, the first clock signal CKS has a high-level to turn off the sixth transistor MP6, and the second clock signal CKBS has a low-level to turn on the third transistor MP3. The second electrical level signal VGLS has a low-level and is transmitted to the gate electrode of the second transistor MP2 via the third transistor MP3 to turn on the second transistor MP2, and then further transmitted to the gate electrode of the fifth transistor MP5 via the second transistor MP2 to turn on the fifth transistor MP5. Then, the second electrical level signal VGLS is transmitted to the output terminal OUT via the fifth transistor MP5 as an output signal OUTS of the third stage T3'. In addition, the output signal OUTS of the third stage T3' is a low-level signal, which is inverse to the initial signal INS, therefore the function of the inverter is accomplished at the third stage T3'.

It should be noted that, in the third stage T3', the second clock signal CKBS has a low-level to turn on the third transistor MP3. Thus, the electrical potential at the gate electrode of the second transistor MP2 is lowered. Meanwhile, the third transistor MP3 is turned off when the electrical potential at the gate electrode of the second transistor MP2 reaches a sum of a level value of the second clock signal CKBS and an absolute value of a threshold voltage of the third transistor MP3 (because the source electrode of the third transistor MP3 is electrically connected with the gate electrode of the second transistor MP2).

In addition, when the output signal OUTS changes from a high-level to a low-level, the electrical potential at the gate electrode of the fifth transistor MP5 is much lowered because of the Bootstrap effect of the second capacitor C2, thus ensuring that the fifth transistor MP5 is completely turned on and the output terminal OUT may completely output a low-level of the second electrical level signal VGLS. Thus, when the first clock signal CKS changes from a low-level to a high-level, the first clock signal CKS may not affect the electrical potential at the gate electrode of the fifth transistor MP5, and hence may not affect a level value of the output signal OUTS at the output terminal OUT, which leads to a stable resultant output signal OUTS.

Further, because the equivalent circuit diagram of the inverter at the third stage T3' is the same as that at the first stage T1', referring to FIGS. 10A and 10B, at the third stage T3', the sum of the drain-source voltage $V_{DS}$ of the first transistor MP1 and the drain-source voltage $V_{DS}$ of the sixth transistor MP6 is approximately 12V (i.e., CKB−N1=−5V+17V=12V)

Compared to the inverter without the sixth transistor shown in FIG. 2A, the sixth transistor MP6 in the inverter shown in FIG. 10A may significantly reduce the drain-source voltage $V_{DS}$ of the first transistor MP1. For example, the sum of the drain-source voltage $V_{DS}$ of the first transistor MP1 and the drain-source voltage $V_{DS}$ of the sixth transistor MP6 is approximately 12V. Assuming that the first transistor MP1 and the sixth transistor MP6 have similar characteristics, the drain-source voltage $V_{DS}$ of the first transistor MP1 may be reduced to approximately 6V, while the drain-source voltage $V_{DS}$ of the first transistor MP1 in FIG. 2A is approximately 25V.

Thus, the corresponding drain-source leakage current of the first transistor MP1 may be significantly reduced, while the drain-source leakage current of the sixth transistor MP6 may be still substantially small, for example, comparable to the drain-source leakage current of the first transistor MP1. Thus, the first transistor MP1 and the sixth transistor MP6 may be effectively protected from failure due to a substantially large drain-source leakage current. Accordingly, the inverter malfunction due to the failure of the first transistor MP1 and the sixth transistor MP6 may be eliminated, and the reliability of the inverter may be significantly improved.

At the fourth stage T4', as shown in FIG. 11C, the initial signal INS has a high-level to turn off the first transistor MP1 and the fourth transistor MP4, the first clock signal CKB has a high-level to turn on the third transistor MP3, and the first clock signal CKS has a low-level to turn on the sixth transistor MP6. The first clock signal CKS controls the electrical potential at the gate electrode of the second transistor MP2 via the first capacitor C1 to turn on the second transistor MP2, the electrical potential at the gate electrode of the second transistor MP2 controls the electrical potential at the gate electrode of the fifth transistor MP5 via the second transistor MP2 to turn on the fifth transistor MP5, and the second electrical level signal VGLS is transmitted to the output terminal OUT via the fifth transistor MP5 as an output signal OUTS of the fourth stage T4'. In addition, the output signal OUTS of the fourth stage T4' is a low-level signal, which is inverse to the initial signal INS, therefore the function of the inverter is accomplished at the fourth stage T4'.

It should be noted that, in the fourth stage T4', the initial signal INS has a high-level to turn off the first transistor MP1, and the second clock signal CKBS has a high-level to turn off the third transistor MP3. Meanwhile, the electrical potential at the gate electrode of the second transistor MP2 becomes lower, due to the Bootstrap effect of the first capacitor C1. When the first clock signal CKS changes from a high-level to a low-level, the second transistor MP2 is turned on, the electrical potential at the gate electrode of the fifth transistor MP5 is low, and the fifth transistor MP5 continuously transmits the level value of the second electrical level signal VGLS to the output terminal OUT. Thus, when the first clock signal CKS changes from a high-level to a low-level, a level value of the output signal OUTS of the output terminal OUT may not be affected, which leads to a stable resultant output signal OUTS.

Further, referring to FIGS. 10A and 10B, at the fourth stage T4', the first transistor MP1 is turned off and the sixth transistor MP6 is turned on. According to the simulation results in FIG. 16, the voltage at the node N1 (i.e., the voltage at the gate electrode of the third transistor MP3) and the voltage at the node A (i.e., the voltage at the drain electrode of the first transistor MP1) is respectively calculated to be approximately −17V and −5V. Thus, the drain-source voltage $V_{DS}$ of the first transistor MP1 is approximately 15V, and the drain-source voltage $V_{DS}$ of the sixth transistor MP6 is approximately 12V.

Thus, compared to the inverter without the sixth transistor shown in FIG. 2A, the sixth transistor MP6 in the inverter shown in FIG. 10A may significantly reduce the drain-source voltage $V_{DS}$ of the first transistor MP1, for example, from 27V to 15V, while the drain-source voltage $V_{DS}$ of the sixth transistor MP6 may be still substantially small. For example, the drain-source voltage $V_{DS}$ of the sixth transistor MP6 may be comparable to the drain-source voltage $V_{DS}$ of the first transistor MP1.

Accordingly, the corresponding drain-source leakage current of the first transistor MP1 may be respectively reduced, while the drain-source leakage current of the sixth transistor MP6 may be still substantially small. Thus, the first transistor MP1 and the sixth transistor MP6 may be effectively protected from failure due to a substantially large drain-source leakage current. Accordingly, the inverter malfunction due to the failure of the first transistor MP1 and the sixth transistor MP6 may be eliminated, and the reliability of the inverter may be significantly improved.

It can be seen from FIG. 10B, the inverter operates alternately in the third stage T3' and the fourth stage T4' between two adjacent second stages T2'. In addition, the output signal OUTS of the inverter of the second embodiment in the third stage T3' and the fourth stage T4' is not affected by the change of the first clock signal CKS and, thus, the inverter of the second embodiment may obtain a stable output signal OUTS.

In addition, due to the sixth transistor, the drain-source voltage $V_{DS}$ when the first transistor is turned off may be significantly reduced and, thus, the corresponding drain-source leakage current of the first transistor may be reduced, while the drain-source leakage current of the sixth transistor may be still substantially small. The first transistor and the sixth transistor may be effectively protected from failure due to a substantially large drain-source leakage current and, accordingly, the inverter malfunction due to the failure of the first transistor and the sixth transistor may be eliminated, and the reliability of the inverter may be significantly improved.

It should be noted that, FIG. 10A is only a specific example showing an electrical connection of the gate electrode of the fifth transistor MP5 and the second capacitor C2, which is not intended to limit the scope of the present disclosure. For example, in certain embodiments, the gate electrode of the fifth transistor MP5 is electrically connected with the second clock signal CKBS via the second capacitor C2.

Eighth Embodiment

Figure 12A:
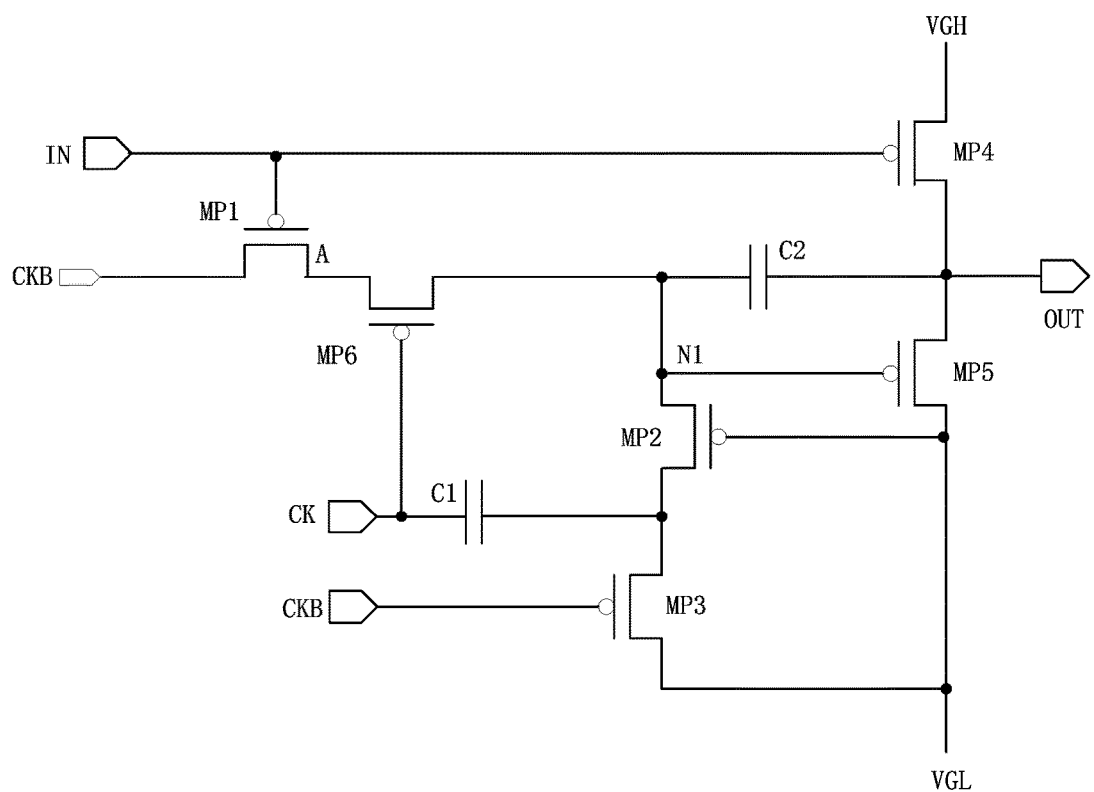
FIG. 12A is a circuit diagram of an inverter according to an eighth embodiment of the disclosure.

FIG. 12A is a circuit diagram of an inverter according to an eighth embodiment of the disclosure. As shown in FIG. 12A, an inverter in the eighth embodiment of the disclosure includes a first transistor MP1, a second transistor MP2, a third transistor MP3, a fourth transistor MP4, a fifth transistor MP5, a sixth transistor MP6, a first capacitor C1 and a second capacitor C2.

A gate electrode of the first transistor MP1 is electrically connected with an initial signal input terminal IN for receiving an initial signal, a source electrode of the first transistor MP1 is electrically connected with a second clock signal input terminal CKB for receiving a second clock signal, and a drain electrode of the first transistor MP1 is electrically connected with a source electrode of the sixth transistor MP6.

A gate electrode of the second transistor MP2 is electrically connected with the second electrical level signal input terminal VGL, and the drain electrode of the second transistor MP2 is electrically connected, via the first capacitor C1, with a first clock signal input terminal CK for receiving a first clock signal.

A gate electrode of the third transistor MP3 is electrically connected with a second clock signal input terminal CKB for receiving a second clock signal, a source electrode of the third transistor MP3 is electrically connected with the drain electrode of the second transistor MP2, and a drain electrode of the third transistor MP3 is electrically connected with the second electrical level signal input terminal VGL for receiving a second electrical level signal.

A gate electrode of the fourth transistor MP4 is electrically connected with the initial signal input terminal IN, a source electrode of the fourth transistor MP4 is electrically connected with the first electrical level signal input terminal VGH, and a drain electrode of the fourth transistor MP4 is electrically connected with an output terminal OUT for outputting an output signal.

A gate electrode of the fifth transistor MP5 is electrically connected with the output terminal OUT via the second capacitor C2, a source electrode of the fifth transistor MP5 is electrically connected with the output terminal OUT, and a drain electrode of the fifth transistor MP5 is electrically connected with the second electrical level signal input terminal VGL.

A gate electrode of the sixth transistor MP6 is electrically connected with the first clock signal input terminal CK for receiving the first clock signal, a drain electrode of the sixth transistor MP6 is electrically connected with the output terminal OUT via the second capacitor C2, and the drain electrode of the sixth transistor MP6 is also electrically connected with the gate electrode of the fifth transistor MP5.

As shown in FIG. 12A, in the eighth embodiment based on the sixth embodiment, the gate electrode of the second transistor MP2 is electrically connected with the second electrical level signal input terminal VGL, such that the second transistor MP2 is continuously turned on and, thus, reverse conduction of the second transistor MP2 may be prevented. Further, the gate electrode of the fifth transistor MP5 is electrically connected with the output terminal OUT via the second capacitor C2, such that the electrical potential at the gate electrode of the fifth transistor MP5 is maintained via the second capacitor C2.

Figure 12B:
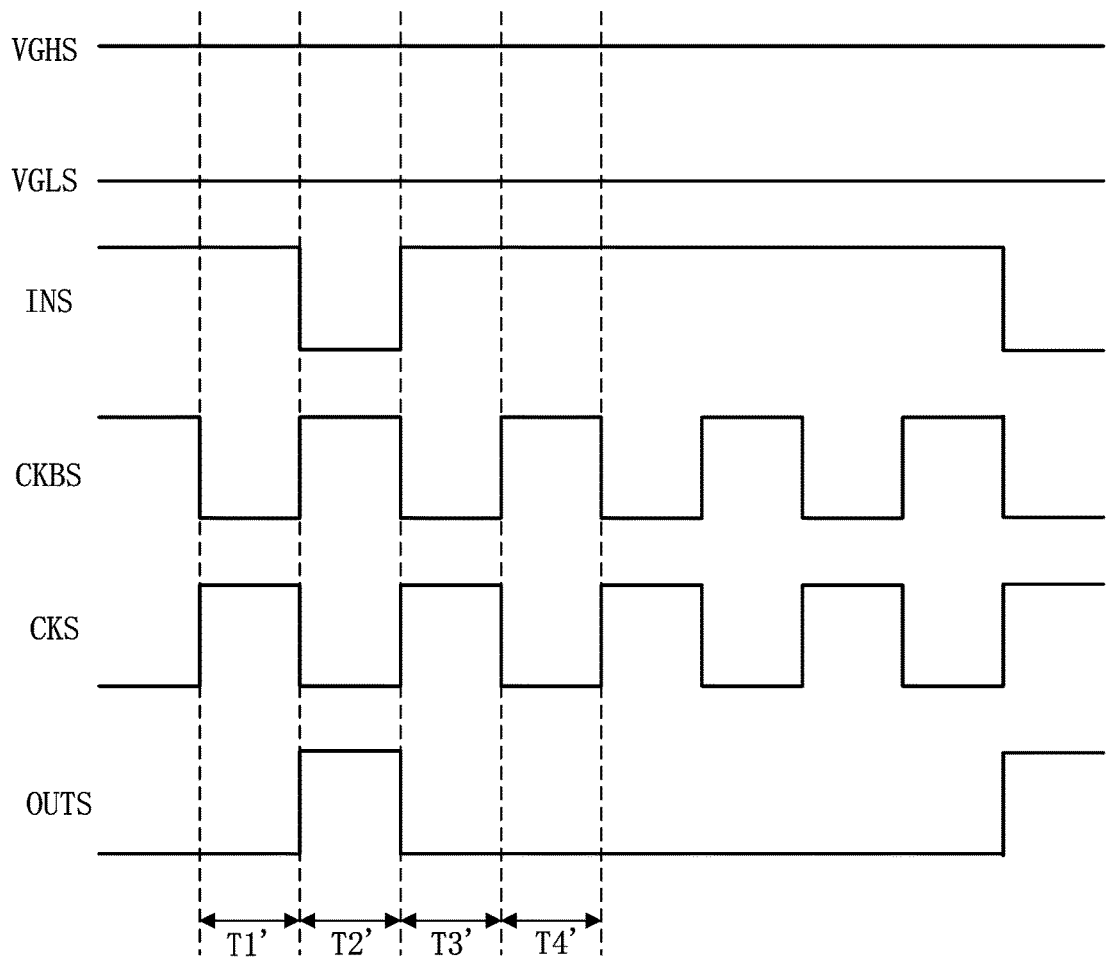
FIG. 12B is a diagram showing waveforms of various signals of the inverter shown in FIG. 12A.

FIG. 12B is a diagram showing waveforms of various signals of the inverter shown in FIG. 12A. As shown in FIG. 12B, INS represents the initial signal, CKS represents the first clock signal, CKBS represents the second clock signal, VGHS represents the first electrical level signal, VGLS represents the second electrical level signal, and OUTS represents the output signal. It should be noted that, in FIG. 12B, the first electrical level signal VGHS is a constant high-level signal, and the second electrical level signal VGLS is a constant low-level signal.

Figure 13A:
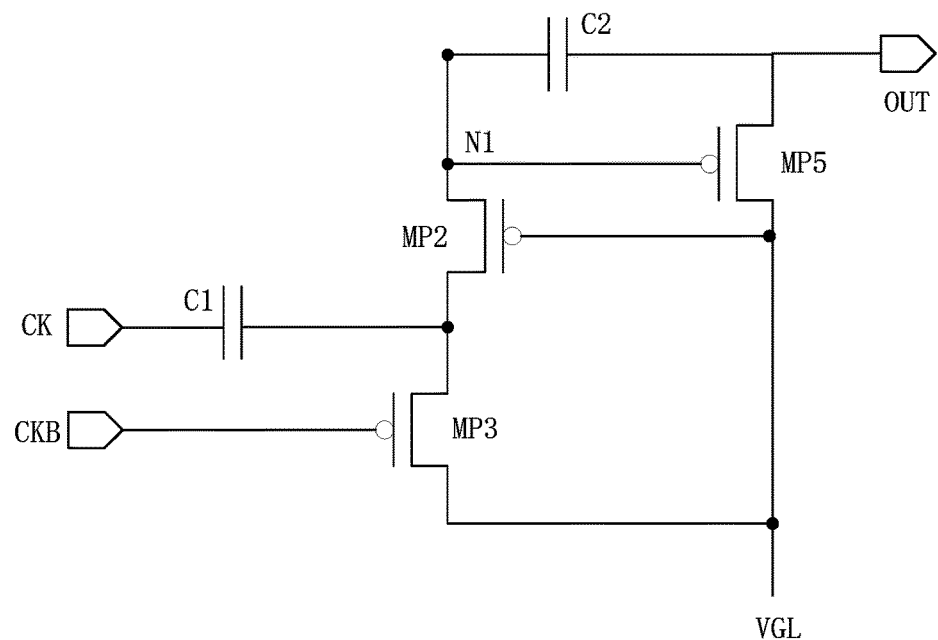
FIGS. 13A to 13C are equivalent circuit diagrams of the inverter shown in FIG. 12A corresponding to various stages shown in FIG. 12B.
Figure 13B:
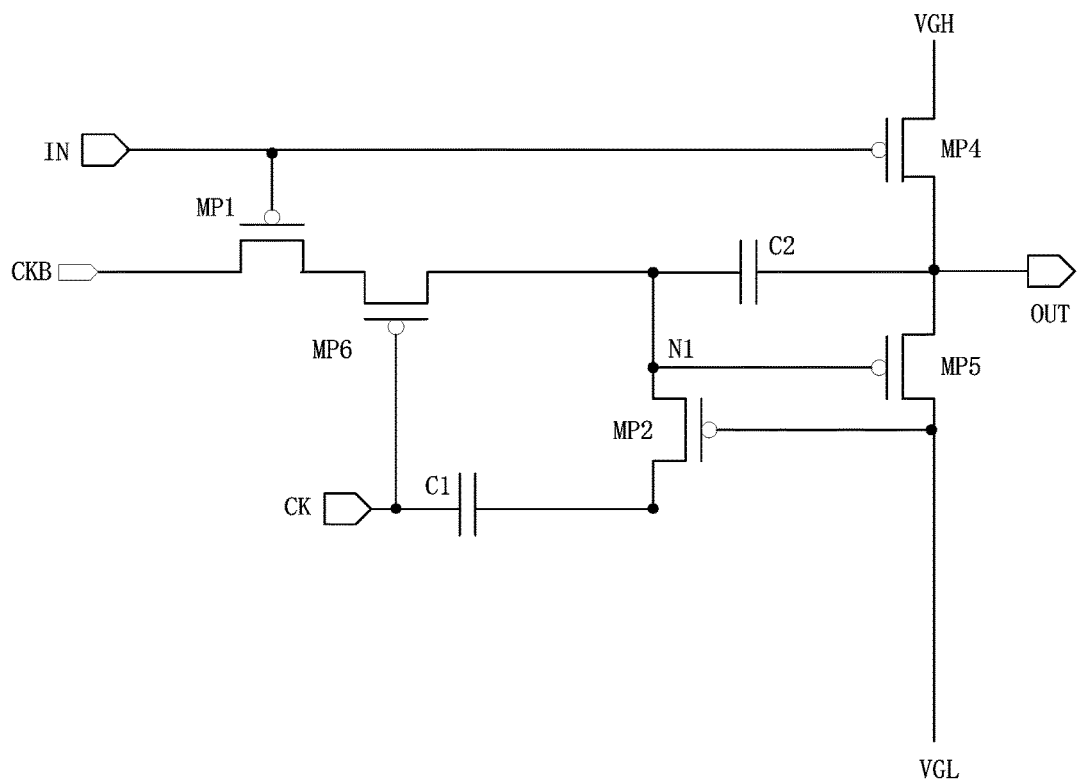
Figure 13C:
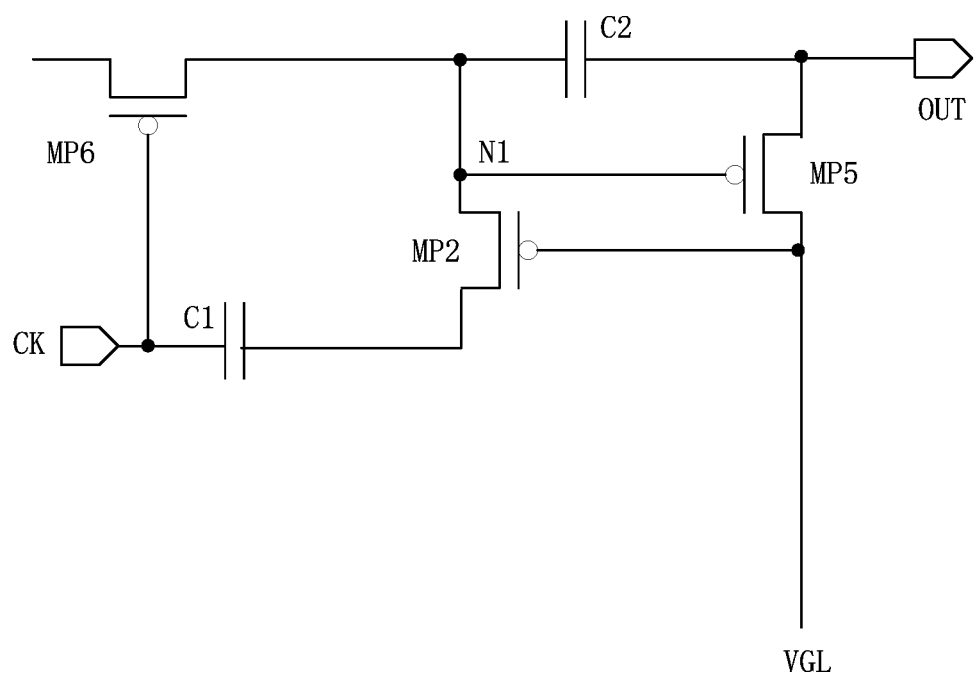

FIGS. 13A to 13C are equivalent circuit diagrams of the inverter shown in FIG. 5A corresponding to various stages shown in FIG. 12B. Refer to FIGS. 12B and 13A to 13C, the working status of the inverter includes a first stage T1', a second stage T2', a third stage T3' and a fourth stage T4'.

At the first stage T1', as shown in FIGS. 12B and 13A, the initial signal INS has a high-level to turn off the first transistor MP1 and the fourth transistor MP4, and the first clock signal CKS has a high-level to turn off the sixth transistor MP6. The second clock signal CKBS has a low-level to turn on the third transistor MP3, and the second electrical level signal VGLS has a low-level and controls the second transistor MP2 to turn on.

The second electrical level signal VGLS is transmitted to the gate electrode of the fifth transistor MP5 via the third transistor MP3 and the second transistor MP2 in turn to control the fifth transistor MP5 to turn on, such that the second electrical level signal VGLS is transmitted to the output terminal OUT via the fifth transistor MP5 as an output signal OUTS of the first stage T1'. In addition, the output signal OUTS of the first stage T1 is a low-level signal, which is inverse to the initial signal INS, therefore the function of the inverter is accomplished at the first stage T1.

Further, as shown in FIGS. 12A and 12B, at the first stage T1', the second clock signal CKBS has a low-level, the first clock signal CKS has a high-level, the first transistor MP1 and the sixth transistor MP6 are both turned off. Similarly, the voltage at the node N1 (i.e., the voltage at the gate electrode of the third transistor MP3) is calculated to be approximately −17V. Thus, the sum of the drain-source voltage $V_{DS}$ of the first transistor MP1 and the drain-source voltage $V_{DS}$ of the sixth transistor MP6 is approximately 12V (i.e., CKB−N1=−5V+17V=12V)

Compared to the inverter without the sixth transistor shown in FIG. 2A, the sixth transistor MP6 in the inverter shown in FIG. 12A may significantly reduce the drain-source voltage $V_{DS}$ of the first transistor MP1. For example, the sum of the drain-source voltage $V_{DS}$ of the first transistor MP1 and the drain-source voltage $V_{DS}$ of the sixth transistor MP6 is approximately 12V. Assume the first transistor MP1 and the sixth transistor MP6 have similar characteristics, the drain-source voltage $V_{DS}$ of the first transistor MP1 may be reduced to approximately 6V, while the drain-source voltage $V_{DS}$ of the first transistor MP1 in FIG. 2A is approximately 25V.

Thus, the corresponding drain-source leakage current of the first transistor MP1 may be significantly reduced, while the drain-source leakage current of the sixth transistor MP6 may be still substantially small, for example, comparable to the drain-source leakage current of the first transistor MP1. Thus, the first transistor MP1 and the sixth transistor MP6 may be effectively protected from failure due to a substantially large drain-source leakage current. Accordingly, the inverter malfunction due to the failure of the first transistor MP1 and the sixth transistor MP6 may be eliminated, and the reliability of the inverter may be significantly improved.

At the second stage T2', as shown in FIGS. 12B and 13B, the initial signal INS has a low-level to turn on the first transistor MP1 and the fourth transistor MP4, and the first clock signal CKB has a low-level to turn on the sixth transistor MP6. The second clock signal CKBS has a high-level and is transmitted to the gate electrode of the fifth transistor MP5 via the first transistor MP1 and the sixth transistor MP6 to turn off the fifth transistor MP5.

The second electrical level signal VGLS has a low-level to keep the second transistor MP2 turned on, the second clock signal CKBS has a high-level to turn off the third transistor MP3, such that the first electrical level signal VGHS is transmitted to the output terminal OUT via the fourth transistor MP4 as an output signal OUTS of the second stage T2'. In addition, the output signal OUTS of the second stage T2' is a high-level signal, which is inverse to the initial signal INS, therefore the function of the inverter is accomplished at the second stage T2'.

At the third stage T3', as shown in FIGS. 12B and 13A (the equivalent circuit diagram of the inverter at the third stage T3' is the same as that at the first stage T1'), the initial signal INS has a high-level to turn off the first transistor MP1 and the fourth transistor MP4, and the first clock signal CKS has a high-level to turn off the sixth transistor MP6. The second clock signal CKBS has a low-level to turn on the third transistor MP3, the second electrical level signal VGLS has a low-level to keep the second transistor MP2 turned on.

The second electrical level signal VGLS is transmitted to the gate electrode of the fifth transistor MP5 via the third transistor MP3 and the second transistor MP2 to turn on the fifth transistor MP5, and then further transmitted to the output terminal OUT via the fifth transistor MP5 as an output signal OUTS of the third stage T3'. In addition, the output signal OUTS of the third stage T3 is a low-level signal, which is inverse to the initial signal INS, therefore the function of the inverter is accomplished at the third stage T3'.

It should be noted that, in the third stage T3', the second clock signal CKBS has a low-level to turn on the third transistor MP3, the second electrical level signal VGLS has a low-level and is transmitted to the gate electrode of the fifth transistor MP5 via the third transistor MP3 and the second transistor MP2. In addition, when the output signal OUTS changes from a high-level to a low-level, the electrical potential at the gate electrode of the fifth transistor MP5 is much lowered because of the Bootstrap effect of the second capacitor C2, thus ensuring that the fifth transistor MP5 is completely turned on and the output terminal OUT may completely output a low-level of the second electrical level signal VGLS.

Thus, when the first clock signal CKS changes from a low-level to a high-level, the first clock signal CKS may not affect the electrical potential at the gate electrode of the fifth transistor MP5, and hence may not affect a level value of the output signal OUTS at the output terminal OUT, which may lead to a stable resultant output signal OUTS.

Further, because the equivalent circuit diagram of the inverter at the third stage T3' is the same as that at the first stage T1', referring to FIGS. 12A and 12B, at the third stage T3', the sum of the drain-source voltage $V_{DS}$ of the first transistor MP1 and the drain-source voltage $V_{DS}$ of the sixth transistor MP6 is approximately 12V (i.e., CKB−N1=−5V+17V=12V)

Compared to the inverter without the sixth transistor shown in FIG. 2A, the sixth transistor MP6 in the inverter shown in FIG. 12A may significantly reduce the drain-source voltage $V_{DS}$ of the first transistor MP1. For example, the sum of the drain-source voltage $V_{DS}$ of the first transistor MP1 and the drain-source voltage $V_{DS}$ of the sixth transistor MP6 is approximately 12V. Assume the first transistor MP1 and the sixth transistor MP6 have similar characteristics, the drain-source voltage $V_{DS}$ of the first transistor MP1 may be reduced to approximately 6V, while the drain-source voltage $V_{DS}$ of the first transistor MP1 in FIG. 2A is approximately 25V.

Thus, the corresponding drain-source leakage current of the first transistor MP1 may be significantly reduced, while the drain-source leakage current of the sixth transistor MP6 may be still substantially small, for example, comparable to the drain-source leakage current of the first transistor MP1. Thus, the first transistor MP1 and the sixth transistor MP6 may be effectively protected from failure due to a substantially large drain-source leakage current. Accordingly, the inverter malfunction due to the failure of the first transistor MP1 and the sixth transistor MP6 may be eliminated, and the reliability of the inverter may be significantly improved.

At the fourth stage T4', as shown in FIGS. 12B and 13C, the initial signal INS has a high-level to turn off the first transistor MP1 and the fourth transistor MP4, and the first clock signal CKS has a low-level to turn on the sixth transistor MP6. The second clock signal CKBS has a high-level to turn off the third transistor MP3, the second electrical level signal VGLS has a low-level to keep the second transistor MP2 turned on, the first clock signal CKS has a low-level and controls the electrical potential at the drain electrode of the second transistor MP2 via the first capacitor C1.

The electrical potential at the drain electrode of the second transistor MP2 controls the electrical potential at the gate electrode of the fifth transistor MP5 via the second transistor MP2 to turn on the fifth transistor MP5, so that the second electrical level signal VGLS is transmitted to the output terminal OUT via the fifth transistor MP5 as an output signal OUTS of the fourth stage T4'. In addition, the output signal OUTS of the fourth stage T4' is a low-level signal, which is inverse to the initial signal INS, therefore the function of the inverter is accomplished at the fourth stage T4'.

It should be noted that, in the fourth stage T4', the initial signal INS has a high-level to turn off the first transistor MP1, the second clock signal CKBS has a high-level to turn off the third transistor MP3, and the electrical potential at the drain electrode of the second transistor MP2 become lower because of the Bootstrap effect of the first capacitor C1. When the first clock signal CKS changes from a high-level to a low-level, the electrical potential at the gate electrode of the fifth transistor MP5 is low through the second transistor MP2 which is turned on. Thus, the fifth transistor MP5 continuously transmits the level value of the second electrical level signal VGLS to the output terminal OUT. Thus, when the first clock signal CKS changes from a high-level to a low-level, a level value of the output signal OUTS of the output terminal OUT may not be affected, which may lead to a stable resultant output signal OUTS.

Further, referring to FIGS. 12A and 12B, at the fourth stage T4', the first transistor MP1 is turned off and the sixth transistor MP6 is turned on. The voltage at the node N1 (i.e., the voltage at the gate electrode of the third transistor MP3) and the voltage at the node A (i.e., the voltage at the drain electrode of the first transistor MP1) is respectively calculated to be approximately −17V and −5V. Thus, the drain-source voltage $V_{DS}$ of the first transistor MP1 is approximately 15V, and the drain-source voltage $V_{DS}$ of the sixth transistor MP6 is approximately 12V.

Thus, compared to the inverter without the sixth transistor shown in FIG. 2A, the sixth transistor MP6 in the inverter shown in FIG. 12A may significantly reduce the drain-source voltage $V_{DS}$ of the first transistor MP1, for example, from 27V to 15V, while the drain-source voltage $V_{DS}$ of the sixth transistor MP6 may be still substantially small. For example, the drain-source voltage $V_{DS}$ of the sixth transistor MP6 may be comparable to the drain-source voltage $V_{DS}$ of the first transistor MP1.

Accordingly, the corresponding drain-source leakage current of the first transistor MP1 may be respectively reduced, while the drain-source leakage current of the sixth transistor MP6 may be still substantially small. Thus, the first transistor MP1 and the sixth transistor MP6 may be effectively protected from failure due to a substantially large drain-source leakage current. Accordingly, the inverter malfunction due to the failure of the first transistor MP1 and the sixth transistor MP6 may be eliminated, and the reliability of the inverter may be significantly improved.

It can be seen from FIG. 12B that the inverter works alternately in the third stage T3' and the fourth stage T4' between two adjacent second stages T2'. In addition, the output signal OUTS of the inverter of the second embodiment in the third stage T3' and the fourth stage T4' is not affected by the change of the first clock signal CKS and, thus, the inverter of the second embodiment may obtain a stable output signals OUTS.

In addition, due to the sixth transistor, the drain-source voltage $V_{DS}$ when the first transistor is turned off may be significantly reduced and, thus, the corresponding drain-source leakage current of the first transistor may be reduced, while the drain-source leakage current of the sixth transistor may be still substantially small. The first transistor and the sixth transistor may be effectively protected from failure due to a substantially large drain-source leakage current and, accordingly, the inverter malfunction due to the failure of the first transistor and the sixth transistor may be eliminated, and the reliability of the inverter may be significantly improved.

It should be noted that, FIG. 12A is only a specific example showing an electrical connection of the gate electrode of the fifth transistor MP5 and the second capacitor C2, which is not intended to limit the scope of the present disclosure. For example, in certain embodiments, the gate electrode of the fifth transistor MP5 is electrically connected with the second clock signal CKBS via the second capacitor C2.

Ninth Embodiment

Figure 14:
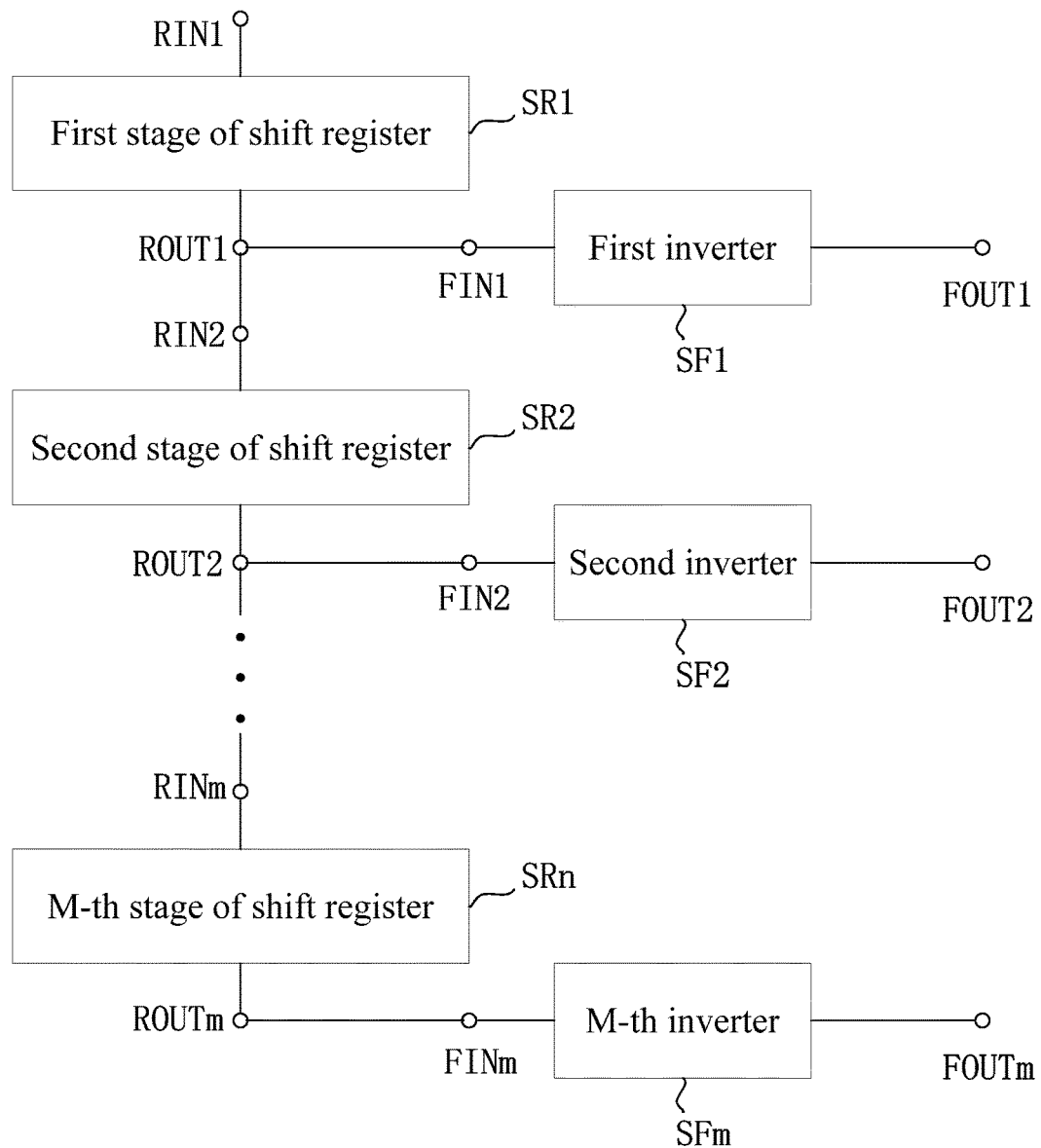
FIG. 14 is a schematic diagram of a structure of a driving circuit according to a ninth embodiment of the disclosure.

The ninth embodiment of the disclosure provides a driving circuit. FIG. 14 is a schematic diagram of a structure of a driving circuit according to the fourth embodiment of the disclosure. As shown in FIG. 14, the driving circuit may include n stages of shift registers and m inverters, where m is an integer greater than 1. The m stages of shift registers include a first stage of shift register, a second stage of shift register, . . . , an m-th stage of shift register (SR1 to SRm), and the m inverters include a first inverter, a second inverter, . . . , an m-th inverter (SF1 to SFm). Each stage of the shift register has an input terminal (with all the input terminals of the stages of shift registers being represented by RIN1 to RINm, respectively) and an output terminal (with all the output terminals of the stages of shift registers being represented by ROUT1 to ROUTm, respectively), and each inverter has an input terminal (with all the input terminals of the inverters being represented by FIN1 to FINm, respectively) and an output terminal (with al the output terminals of the inverters being represented by FOUT1 to FOUTm, respectively); an input terminal RIN1 of the first stage of shift register SR1 is used as an input terminal of the driving circuit.

Starting from the second stage of shift register SR2, an input terminal of each stage of shift register is electrically connected with an output terminal of the immediately preceding stage of shift register, and an output terminal ROUTi of each i-th stage of shift register is electrically connected with an input terminal FINi of the i-th inverter, where 1≤i≤m. The output terminal of each of the m inverters is used as a corresponding output terminal of the driving circuit. The inverter is configured to invert an output signal of the shift register electrically connected with the inverter, and to output the obtained inverted signal as an output signal of the driving circuit. Here, the m inverters are the inverters mentioned in any of the sixth to eighth embodiments.

The driving circuit provided in the disclosed embodiment adopts inverters with stable output signals and improved reliability, such that the driving circuit may output stable output signals and, meanwhile, the reliability of the driving circuit may be significantly improved.

Tenth Embodiment

Figure 15A:
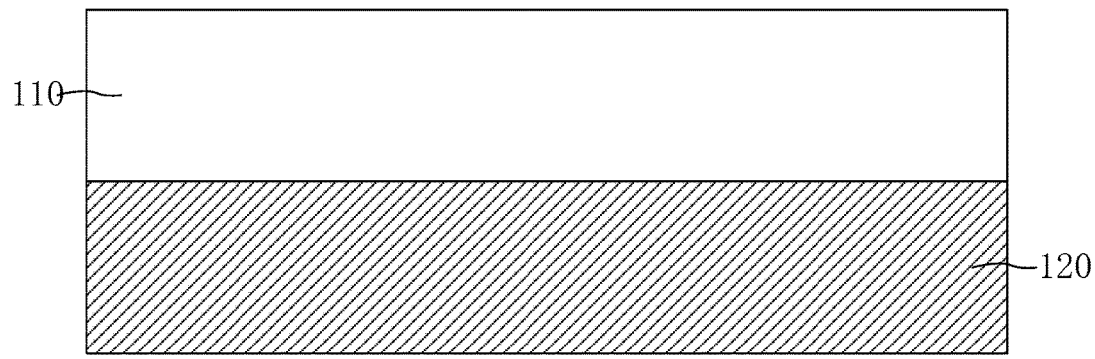
FIG. 15A is a schematic diagram of a structure of a display panel according to a tenth embodiment of the disclosure.

The tenth embodiment of the disclosure provides a display panel. FIG. 15A is a schematic diagram of a structure of a display panel according to in the fifth embodiment of the disclosure. As shown in FIG. 15A, the display panel in the tenth embodiment includes a first substrate 110, and a second substrate 120 arranged opposite to the first substrate 110, where the first substrate 110 may be a color filter substrate, a cover glass, a cover lens or the like, and the second substrate 120 may be a pixel array substrate.

Figure 15B:
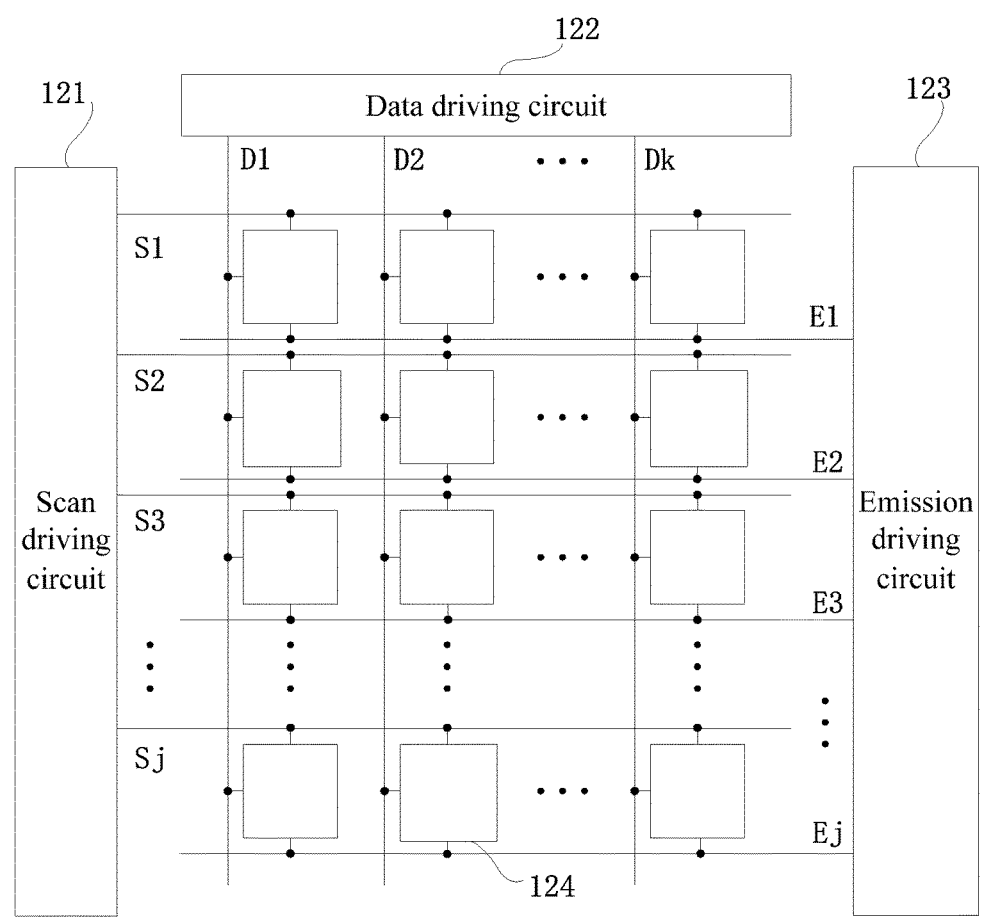
FIG. 15B is a schematic diagram of a structure of a second substrate according to a tenth embodiment of the disclosure.

FIG. 15B is a schematic diagram of a structure of the second substrate according to the fifth embodiment of the disclosure. As shown FIG. 15B, if the second substrate is a pixel array substrate, the second substrate may include a scan driving circuit 121, a data driving circuit 122, an emission driving circuit 123, j scanning lines (S1, S2, . . . , Sj), k data lines (D1, D2, . . . , Dk), j emission driving lines (E1, E2, . . . , Ej) and a plurality of pixels 124, where j and k are positive integers, respectively, and the emission driving circuit 123 may include the driving circuit mentioned in the ninth embodiment and is not repeated here.

In particular, the scan driving circuit 121 is configured to provide scanning signals for the various scanning lines (S1, S2, . . . , Sj), the data driving circuit 122 is configured to provide data signals for the various data lines (D1, D2, . . . , Dk), and the emission driving circuit 123 is configured to provide emission driving signals for the various emission driving lines (E1, E2, . . . , Ej), to implement the node initialization, threshold value compensation, data writing and the like by a pixel compensation circuit in the pixel 124; the pixels 124 are respectively arranged in areas formed by intersecting the scanning lines with the data lines.

By disposing the driving circuit with stable output signals and improved reliability on the second substrate of the display panel, the display panel provided in the tenth embodiment of the disclosure may enable pixels on the second substrate to operate stably and reliably, thus enhancing the display performance and reliability of the corresponding display panel.

With the disclosed inverter, the driving circuit and the display panel provided by the disclosed embodiments, the reverse conduction of the second transistor is prevented through the control over the gate electrode of the second transistor, and the electrical potential at the gate electrode of the fifth transistor is maintained by the second capacitor. The electrical potential at the gate electrode of the fifth transistor may be maintained stable when the first clock signal changes from a high-level to a low-level (when the first to sixth transistors are all NMOS transistors) or from a low-level to a high-level (when the first to sixth transistors are all PMOS transistors). Thus, the output signal of the inverter may not be affected by the change of the first clock signal, enabling the inverter to generate a stable output signal and enabling the display panel comprising the inverter to obtain a better display effect.

Meanwhile, due to the sixth transistor, the drain-source voltage $V_{DS}$ when the first transistor is turned off may be significantly reduced and, accordingly, the drain-source leakage current of the first transistor may be reduced, while the drain-source leakage current of the sixth transistor may be still substantially small. That is, even when the first transistor is turned off, the sixth transistor may be periodically turned on and turned off to protect the first transistor from failure caused by substantially large drain-source leakage current.

Thus, the first transistor and the sixth transistor may be effectively protected from failure caused by substantially large drain-source leakage current and, accordingly, the inverter malfunction due to the failure of the first transistor and the sixth transistor may be eliminated, and the reliability of the inverter may be significantly improved. The display panel comprising the inverter may also exhibit an improved reliability.

It is noted that the preferable embodiments and the applied technology principles of the present disclosure are merely described as above. It should be understood for those skilled in the art that the present disclosure is not limited to particular embodiments described herein. Various apparent changes, readjustment and alternative can be made by those skilled in the art without departing from the scope of protection of the present disclosure. Therefore, although the present disclosure is illustrated in detail through the above specific embodiments, the present disclosure is not limited to the above embodiments, and can further include more of other equivalent embodiments without departing from the concept of the present disclosure. The scope of the present disclosure is subject to the appended claims.

What is claimed is:
1. An inverter, comprising:
a first transistor, wherein a gate electrode of the first transistor is electrically connected with an initial signal input terminal for receiving an initial signal, and a source electrode of the first transistor is electrically connected with a second clock signal input terminal for receiving a second clock signal;

a second transistor, wherein a drain electrode of the second transistor is electrically connected, via a first capacitor, with a first clock signal input terminal for receiving a first clock signal;

a third transistor, wherein a gate electrode of the third transistor is electrically connected with the second clock signal input terminal for receiving the second clock signal, a source electrode of the third transistor is electrically connected with the drain electrode of the second transistor, and a drain electrode of the third transistor is electrically connected with a second electrical level signal input terminal for receiving a second electrical level signal;

a fourth transistor, wherein a gate electrode of the fourth transistor is electrically connected with the initial signal input terminal, a source electrode of the fourth transistor is electrically connected with a first electrical level signal input terminal, and a drain electrode of the fourth transistor is electrically connected with an output terminal for outputting an output signal;

a fifth transistor, wherein a source electrode of the fifth transistor is electrically connected with the output terminal, and a drain electrode of the fifth transistor is electrically connected with the second electrical level signal input terminal;

a sixth transistor, wherein a gate electrode of the sixth transistor is electrically connected with the first clock signal input terminal for receiving the first clock signal, a drain electrode of the sixth transistor is electrically connected with a gate electrode of the fifth transistor and is electrically connected with the output terminal via a second capacitor, and a source electrode of the sixth transistor is electrically connected with a drain electrode of the first transistor;

wherein a gate electrode of the second transistor is controlled in such a way to prevent reverse conduction of the second transistor, the second capacitor is configured to maintain an electrical potential at the gate electrode of the fifth transistor, and the initial signal and the output signal are inverse to each other.

2. The inverter according to claim 1, wherein:
the sixth transistor is configured to reduce a drain-source voltage of the first transistor when the first transistor is turned off.

3. The inverter according to claim 1, wherein:
the gate electrode of the fifth transistor is electrically connected with the output terminal via the second capacitor; or
the gate electrode of the fifth transistor is electrically connected with the first electrical level signal input terminal via the second capacitor.

4. The inverter according to claim 3, wherein the gate electrode of the second transistor is electrically connected with the drain electrode of the second transistor.

5. The inverter according to claim 4, wherein the inverter is configured to operate in a first stage, a second stage, a third stage, and a fourth stage, wherein:
in the first stage, the initial signal turns off the first transistor and the fourth transistor, the first clock signal turns off the sixth transistor, the second clock signal turns on the third transistor, the second electrical level signal is transmitted to the gate electrode of the second transistor via the third transistor to turn on the gate electrode of the second transistor, and then transmitted to the gate electrode of the fifth transistor via the second transistor to turn on the fifth transistor, and then the second electrical level signal is transmitted to the output terminal via the fifth transistor as an output signal of the first stage;

in the second stage, the initial signal turns on the first transistor and the fourth transistor, the first clock signal turns on the sixth transistor, the second clock signal is transmitted to the gate electrode of the fifth transistor via the first transistor and sixth transistor to turn off the fifth transistor, the second clock signal turns off the third transistor, and the first electrical level signal is transmitted to the output terminal via the fourth transistor as an output signal of the second stage;

in the third stage, the initial signal turns off the first transistor and the fourth transistor, the first clock signal turns off the sixth transistor, the second clock signal turns on the third transistor, the second electrical level signal is transmitted to the gate electrode of the second transistor via the third transistor to turn on the second transistor, and then transmitted to the gate electrode of the fifth transistor via the second transistor and turns on the fifth transistor, then the second electrical level signal is transmitted to the output terminal via the fifth transistor as an output signal of the third stage; and in the fourth stage, the initial signal turns off the first transistor and the fourth transistor, the first clock signal turns on the sixth transistor, the second clock signal turns off the third transistor, the first clock signal controls the electrical potential at the gate electrode of the second transistor via the first capacitor to turn on the second transistor, the electrical potential at the gate electrode of the second transistor controls the electrical potential at the gate electrode of the fifth transistor via the second transistor to turn on the fifth transistor, and the second electrical level signal is transmitted to the output terminal via the fifth transistor as an output signal of the fourth stage.

6. The inverter according to claim 3, wherein, the gate electrode of the second transistor is electrically connected with the second electrical level signal input terminal.

7. The inverter according to claim 6, wherein the inverter comprises four operation stages including a first stage, a second stage, a third stage, and a fourth stage, wherein:
in the first stage, the initial signal turns off the first transistor and the fourth transistor, the first clock signal turns off the sixth transistor, the second clock signal turns on the third transistor, the second electrical level signal turns on the second transistor and is transmitted to the gate electrode of the fifth transistor sequentially via the third transistor and the second transistor to turn on the fifth transistor, and then second electrical level signal is transmitted to the output terminal via the fifth transistor as an output signal of the first stage;

in the second stage, the initial signal turns on the first transistor and the fourth transistor, the first clock signal turns on the sixth transistor, the second clock signal is transmitted to the gate electrode of the fifth transistor via the first transistor and sixth transistor to turn off the fifth transistor, the second electrical level signal keeps the second transistor to be turned on, the second clock signal turns off the third transistor, and the first electrical level signal is transmitted to the output terminal via the fourth transistor as an output signal of the second stage;

in the third stage, the initial signal turns off the first transistor and the fourth transistor, the first clock signal turns off the sixth transistor, the second clock signal turns on the third transistor, the second electrical level signal keeps the second transistor to be turned on, the second electrical level signal is transmitted to the gate electrode of the fifth transistor sequentially via the third transistor and the second transistor to turn on the fifth transistor, and the second electrical level signal is transmitted to the output terminal via the fifth transistor as an output signal of the third stage; and in the fourth stage, the initial signal turns off the first transistor and the fourth transistor, the first clock signal turns on the sixth transistor, the second clock signal turns off the third transistor, the second electrical level signal keeps the second transistor to be turned on, the first clock signal controls the electrical potential at the drain electrode of the second transistor via the first capacitor, the electrical potential at the drain electrode of the second transistor controls the electrical potential at the gate electrode of the fifth transistor via the second transistor to turn on the fifth transistor, and the second electrical level signal is transmitted to the output terminal via the fifth transistor as an output signal of the fourth stage.

8. The inverter according to claim 1, wherein the first transistor, the second transistor, the third transistor, the fourth transistor, the fifth transistor, and the sixth transistor are all NMOS transistors or PMOS transistors.

9. The inverter according to claim 1, wherein the initial signal, the output signal, the first clock signal and the second clock signal are all pulse signals, wherein the first clock signal and the second clock signal are complementary to each other.

10. The inverter according to claim 1, wherein the first electrical level signal and the second electrical level signal are both constant signals.

11. A driving circuit, comprising an inverter, wherein the inverter comprising:
   a first transistor, wherein a gate electrode of the first transistor is electrically connected with an initial signal input terminal for receiving an initial signal, and a source electrode of the first transistor is electrically connected with a second clock signal input terminal for receiving a second clock signal;
   a second transistor, wherein a drain electrode of the second transistor is electrically connected, via a first capacitor, with a first clock signal input terminal for receiving a first clock signal;
   a third transistor, wherein a gate electrode of the third transistor is electrically connected with the second clock signal input terminal for receiving the second clock signal, a source electrode of the third transistor is electrically connected with the drain electrode of the second transistor, and a drain electrode of the third transistor is electrically connected with a second electrical level signal input terminal for receiving a second electrical level signal;
   a fourth transistor, wherein a gate electrode of the fourth transistor is electrically connected with the initial signal input terminal, a source electrode of the fourth transistor is electrically connected with a first electrical level signal input terminal, and a drain electrode of the fourth transistor is electrically connected with an output terminal for outputting an output signal;
   a fifth transistor, wherein a source electrode of the fifth transistor is electrically connected with the output terminal, and a drain electrode of the fifth transistor is electrically connected with the second electrical level signal input terminal;
   a sixth transistor, wherein a gate electrode of the sixth transistor is electrically connected with the first clock signal input terminal for receiving the first clock signal, a drain electrode of the sixth transistor is electrically connected with a gate electrode of the fifth transistor and is electrically connected with the output terminal via a second capacitor, and a source electrode of the sixth transistor is electrically connected with a drain electrode of the first transistor;
   wherein a gate electrode of the second transistor is controlled in such a way to prevent reverse conduction of the second transistor, the second capacitor is configured to maintain an electrical potential at the gate electrode of the fifth transistor, and the initial signal and the output signal are inverse to each other.

12. The driving circuit according to claim 11, wherein:
the sixth transistor is configured to reduce a drain-source voltage of the first transistor when the first transistor is turned off.

13. The driving circuit according to claim 11, wherein:
the gate electrode of the fifth transistor is electrically connected with the output terminal via the second capacitor; or
the gate electrode of the fifth transistor is electrically connected with the first electrical level signal input terminal via the second capacitor.

14. The driving circuit according to claim 13, wherein the gate electrode of the second transistor is electrically connected with the drain electrode of the second transistor.

15. The driving circuit according to claim 14, wherein the inverter is configured to operate in a first stage, a second stage, a third stage, and a fourth stage, wherein:
   in the first stage, the initial signal turns off the first transistor and the fourth transistor, the first clock signal turns off the sixth transistor, the second clock signal turns on the third transistor, the second electrical level signal is transmitted to the gate electrode of the second transistor via the third transistor to turn on the gate electrode of the second transistor, and then transmitted to the gate electrode of the fifth transistor via the second transistor to turn on the fifth transistor, and then the second electrical level signal is transmitted to the output terminal via the fifth transistor as an output signal of the first stage;
   in the second stage, the initial signal turns on the first transistor and the fourth transistor, the first clock signal turns on the sixth transistor, the second clock signal is transmitted to the gate electrode of the fifth transistor via the first transistor and sixth transistor to turn off the fifth transistor, the second clock signal turns off the third transistor, and the first electrical level signal is transmitted to the output terminal via the fourth transistor as an output signal of the second stage;
   in the third stage, the initial signal turns off the first transistor and the fourth transistor, the first clock signal turns off the sixth transistor, the second clock signal turns on the third transistor, the second electrical level signal is transmitted to the gate electrode of the second transistor via the third transistor to turn on the second transistor, and then transmitted to the gate electrode of the fifth transistor via the second transistor and turns on the fifth transistor, then the second electrical level signal is transmitted to the output terminal via the fifth transistor as an output signal of the third stage; and
   in the fourth stage, the initial signal turns off the first transistor and the fourth transistor, the first clock signal turns on the sixth transistor, the second clock signal turns off the third transistor, the first clock signal controls the electrical potential at the gate electrode of the second transistor via the first capacitor to turn on the second transistor, the electrical potential at the gate electrode of the second transistor controls the electrical potential at the gate electrode of the fifth transistor via the second transistor to turn on the fifth transistor, and the second electrical level signal is transmitted to the output terminal via the fifth transistor as an output signal of the fourth stage.

16. The driving circuit according to claim 13, wherein, the gate electrode of the second transistor is electrically connected with the second electrical level signal input terminal.

17. The driving circuit according to claim 16, wherein the inverter comprises four operation stages including a first stage, a second stage, a third stage, and a fourth stage, wherein:

in the first stage, the initial signal turns off the first transistor and the fourth transistor, the first clock signal turns off the sixth transistor, the second clock signal turns on the third transistor, the second electrical level signal turns on the second transistor and is transmitted to the gate electrode of the fifth transistor sequentially via the third transistor and the second transistor to turn on the fifth transistor, and then second electrical level signal is transmitted to the output terminal via the fifth transistor as an output signal of the first stage;

in the second stage, the initial signal turns on the first transistor and the fourth transistor, the first clock signal turns on the sixth transistor, the second clock signal is transmitted to the gate electrode of the fifth transistor via the first transistor and sixth transistor to turn off the fifth transistor, the second electrical level signal keeps the second transistor to be turned on, the second clock signal turns off the third transistor, and the first electrical level signal is transmitted to the output terminal via the fourth transistor as an output signal of the second stage;

in the third stage, the initial signal turns off the first transistor and the fourth transistor, the first clock signal turns off the sixth transistor, the second clock signal turns on the third transistor, the second electrical level signal keeps the second transistor to be turned on, the second electrical level signal is transmitted to the gate electrode of the fifth transistor sequentially via the third transistor and the second transistor to turn on the fifth transistor, and the second electrical level signal is transmitted to the output terminal via the fifth transistor as an output signal of the third stage; and in the fourth stage, the initial signal turns off the first transistor and the fourth transistor, the first clock signal turns on the sixth transistor, the second clock signal turns off the third transistor, the second electrical level signal keeps the second transistor to be turned on, the first clock signal controls the electrical potential at the drain electrode of the second transistor via the first capacitor, the electrical potential at the drain electrode of the second transistor controls the electrical potential at the gate electrode of the fifth transistor via the second transistor to turn on the fifth transistor, and the second electrical level signal is transmitted to the output terminal via the fifth transistor as an output signal of the fourth stage.

18. The driving circuit according to claim 11, wherein, the first transistor, the second transistor, the third transistor, the fourth transistor, the fifth transistor, and the sixth transistor are all NMOS transistors or PMOS transistors.

19. The driving circuit according to claim 11, wherein, the initial signal, the output signal, the first clock signal, and the second clock signal are all pulse signals, the first clock signal and the second clock signal are complementary to each other, and the first electrical level signal and the second electrical level signal are both constant signals.

20. A display panel comprising the driving circuit according to claim 11.

* * * * *